(12) United States Patent
Rivas-Davila et al.

(10) Patent No.: US 11,101,792 B2
(45) Date of Patent: Aug. 24, 2021

(54) CIRCUITRY AND METHODOLOGY BENEFITING FROM REDUCED GATE LOSS

(71) Applicant: The Board of Trustees of the Leland Stanford Junior University, Stanford, CA (US)

(72) Inventors: Juan Rivas-Davila, Palo Alto, CA (US); Jiale Xu, Stanford, CA (US); Lei Gu, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 16/847,397

(22) Filed: Apr. 13, 2020

(65) Prior Publication Data

US 2020/0328737 A1 Oct. 15, 2020

Related U.S. Application Data

(60) Provisional application No. 62/833,238, filed on Apr. 12, 2019.

(51) Int. Cl.
| | |
|---|---|
| *H03K 17/16* | (2006.01) |
| *H02M 7/537* | (2006.01) |
| *H02M 7/00* | (2006.01) |
| *H02M 1/08* | (2006.01) |
| *H02M 1/00* | (2006.01) |

(52) U.S. Cl.
CPC .......... *H03K 17/163* (2013.01); *H02M 1/083* (2013.01); *H02M 7/003* (2013.01); *H02M 7/537* (2013.01); *H02M 2001/0058* (2013.01)

(58) Field of Classification Search
CPC ...... H03K 17/10; H03K 17/12; H03K 17/163; H02M 7/537; H02M 1/083; H02M 7/003; H02M 2001/0058
USPC .................................................. 327/108–112
See application file for complete search history.

(56) References Cited

FOREIGN PATENT DOCUMENTS

EP 3001563 A1 * 3/2016 ........... H03K 17/687

OTHER PUBLICATIONS

Wei, H. Jiang, Q. Jiang and K. J. Chen, "Proposal of a novel GaN/SiC hybrid FET (HyFET) with enhanced performance for high-voltage switching applications," 2016 28th International Symposium on Power Semiconductor Devices and ICs (ISPSD), Prague, Jun. 12-16, 2016, pp. 99-102.

(Continued)

*Primary Examiner* — John W Poos
(74) *Attorney, Agent, or Firm* — Crawford Maunu PLLC

(57) ABSTRACT

In specific examples, aspects are directed towards eliminating, mitigating or reducing gate loss in circuits including, for example, WBG power devices. One such example is directed towards an apparatus including first and second types of field-effect transistor (FET), where the first type is characterized as being a normally-on FET in a switching-circuit operation with a high-voltage rating, and the second type of FET is characterized as being a normally-off FET in a switching-circuit operation with a voltage rating that is much less than the high-voltage rating of the first type of FET circuit. The FET are arranged in a cascode manner so that, in response to a switching control signal received by the second type of FET circuit, the second type of FET circuit is active to drive the first type of FET.

20 Claims, 13 Drawing Sheets

(56) References Cited

OTHER PUBLICATIONS

X. Huang, W. Du, F. C. Lee, Q. Li and Z. Liu, "Avoiding Si MOSFET Avalanche and Achieving Zero-Voltage Switching for Cascode GaN Devices," in IEEE Transactions on Power Electronics, vol. 31, No. 1, pp. 593-600, Jan. 2016.
J. Xu, L. Gu, Z. Ye, S. Kargarrazi and J. M. Rivas-Davila, "Cascode GaN/SiC: A Wide-Bandgap Heterogenous Power Device for High-Frequency Applications," in IEEE Transactions on Power Electronics, vol. 35, No. 6, pp. 6340-6349, Jun. 2020. Filed as Appendix in the underlying related U.S. Appl. No. 62/833,238.
J. Xu, L. Gu, Z. Ye, S. Kargarrazi and J. Rivas-Davila, "Cascode GaN/SiC Power Device for MHz Switching," 2019 IEEE Applied Power Electronics Conference and Exposition (APEC), Anaheim, CA, USA, 2019, pp. 2780-2785.
J. Xu, L. Gu and J. Rivas-Davila, "Low-Loss Gate Driving Techniques of the Cascode GaN/SiC Power Device at High Frequencies," 2019 20th Workshop on Control and Modeling for Power Electronics (COMPEL), Toronto, ON, Canada, 2019, pp. 1-6.

* cited by examiner

CIRCUITRY AND METHODOLOGY BENEFITING FROM REDUCED GATE LOSS

Aspects of various embodiments are directed to circuitry and related methods of use and manufacture of such circuitry which realizes benefit from reduced gate loss. Examples of such circuitry includes wide bandgap (WBG) power semiconductors, high-speed/power devices and the like. In the following discussion, various implementations and applications are disclosed to provide an understanding of the instant disclosure by way of non-limiting example embodiments.

The demand for more compact electronic systems has pushed power electronics engineers to explore new topologies, and use new semiconductor and packaging technologies that can lead to increases in power density. By increasing switching frequency, the energy storage in the passive components can be reduced, which can lead to a smaller size. Recently, there have been a growing number of applications using high-frequency power converters such as wireless power transfer and radio-frequency plasma generation. These high-frequency and high-power converters require faster switching devices with low conduction losses, which is difficult to achieve using, as one example of transistor-based switch technology, silicon (Si) metal-oxide semiconductors field-effect transistors (MOSFETs). WBG power devices, on the other hand, have low on-resistance, a wide operating temperature range, and can operate at high frequencies (HF, 3-30 MHz) and very high frequencies (VHF, 30-300 MHz). Other related ranges, such as these ranges but with different lower/upper limits as may be permitted by technology, are also contemplated.

Certain examples of the present disclosure employ GaN devices as well as SiC devices. GaN devices, especially lateral GaN high-electron-mobility transistors (HEMTs), which are useful for relatively low-voltage and high-frequency applications. Since GaN layers are epitaxially grown on other substrates (e.g., Si, SiC, and sapphire), the peak electric field occurs at the surface of a lateral GaN device. Limitations in the maximum electric field due to the lateral structure lead to relatively low voltage ratings (<650 V) in GaN HEMTs. In addition, unlike Si devices, lateral GaN HEMTs are not avalanche-rated. Even though GaN has a higher critical field than Si (>10), it is limited by the low dielectric strength of the surface material, which leads to breakdown in GaN HEMTs. Vertical GaN devices have attracted more attention with their higher device ratings, superior reliability, and better heat removal, as compared to the lateral GaN HEMTs. However, difficulties in material growth and processing in addition to high cost and the limitations of GaN wafers make them hard to manufacture and commercialize. While a GaN device is easier to drive at high frequencies due to its small gate charge, GaN HEMTs have high output capacitance ($C_{oss}$) losses in the HF and VHF range even under Zero-Voltage-Switching (ZVS) conditions, and these losses increase with dV/dt. $C_{oss}$ losses are typically not part of a manufacturer's simulation model but can result in power dissipation that is an order of magnitude higher than the simulated value when operating in the HF or VHF range.

Unlike GaN devices, SiC devices are mostly used in higher voltage and lower frequency applications. They are vertical devices, which have higher voltage ratings than GaN HEMTs: ranging from a few hundred volts to a few killiVolts (kVs). SiC devices are often used at low-frequencies because they have large gate charge and require high-power gate drivers. These gate drive circuits are often bulky and difficult to design. One example shows a 2 kW Class $\phi_2$ inverter with a Si-based gate driver that is larger in size than the SiC MOSFET used as the switching device. At 6.78 MHz, the 20 V gate driver alone consumes 20 W to drive the 1.2 kV SiC MOSFET. To achieve a smaller and lighter power electronics system, integrated SiC-based gate drivers have been demonstrated for SiC devices. However, the power dissipation for such gate drivers is still high, and they are not suitable for HF and VHF applications. Previous research implemented resonant gate drivers to efficiently drive the devices with large gate charge at high frequencies. However, the resonant gate drivers require additional components, increasing the complexity of the circuit. Despite their large gate charge and associated $C_{oss}$ losses, aspects of the present disclosure are directed to topology in which SiC devices are used with GaN devices because they outperform GaN devices at high frequencies and low currents. According to the present disclosure, it has been observed (based in part from recent studies) that the $C_{oss}$ energy loss per cycle of SiC devices is roughly independent of frequency as opposed to GaN devices, which show an $f_s^{0.6}$. Some SiC devices manifest even smaller $C_{oss}$ losses at high frequencies than GaN devices of similar voltage ratings.

Various other exemplary aspects and embodiments are directed to overcoming issues such as those addressed above including $C_{oss}$ losses and/or others which may become apparent from the following disclosure concerning gate loss in such devices including but not limited to certain types of power/switching devices such as but not limited to Gallium nitride (GaN) and silicon carbide (SiC) field-effect transistors which have different/disparate characteristics typically leading to different target applications.

In specific examples, aspects are directed towards eliminating, mitigating or reducing gate loss in circuits including, for example, WBG power devices. Other aspects are directed toward methods involving, or in the manufacture of circuits, including for example an integrated circuit chip, wherein reduced gate loss is realized in part due to the manner in which certain of the semiconductor components in the chip are configured and in which they may also be packaged and arranged.

In a more specific example, an apparatus includes a first type of field-effect transistor (FET) and a second type of FET. The first type of field-effect transistor (FET) circuit is characterized as being a normally-on FET in a switching-circuit operation with a high-voltage rating, and the second type of FET is characterized as being a normally-off FET in a switching-circuit operation with a voltage rating that is less than (e.g., by at least 1-2 orders of magnitude) than the high-voltage rating of the first type of FET circuit. The first and second types of FET circuit are configured in a cascode arrangement in which, in response to a switching control signal received by the second type of FET circuit, the second type of FET circuit is active to drive the first type of FET.

In other more specific examples, the above example may be varied. In one such example, the second type of FET circuit is to drive the first type of FET towards optimization of, or at least mitigate, power loss due to a gate loss associated with the first type of FET circuit. In another, the first type of FET circuit is or at least includes a FET having Silicon Carbide (SiC), and the second type of FET circuit is or at least includes a wide bandgap FET such as a Gallium-Nitride (GaN) FET. Also, the high-voltage rating of the first type of FET circuit may be within, as an exemplary range, a range of a few hundred volts to a few kVolts, and the second type of FET circuit may have a voltage rating of less than 650 Volts. Other related ranges, such as those having other upper limit(s) as may be permitted by applicable technology, are also contemplated.

In yet additional specific examples, one or both the above examples may be varied in further regards including the following. The first type of FET circuit may be characterized in a switching-circuit operation as having a gate charge requirement for the switching-circuit operation that proportionately tracks, for a range of increasing frequencies of switching-circuit operation, with the gate loss wherein the first type of FET circuit is further characterized in a hard gating switching-circuit operation as having gate loss proportional to its gate charge. Also, the first type of FET may be further characterized as including an SiC layer, and wherein the second type of FET includes a GaN layer that manifests a structural orientation corresponding to epitaxial growth of the GaN layer on the SiC layer; this may be a feature manifesting in a device after manufacture and/or as a feature which is part of a method of manufacture such as in a step of semiconductor layering wherein of epitaxial growth of the GaN layer on the SiC layer (in one of more of the above types of apparatuses/circuits) is used to form the GaN layer.

According to another aspects, the above type of apparatus or method of manufacture may include providing an integrated circuit chip having the first type of FET circuit and the second type of FET circuit integrated and configured to render, as being negligible, impedance-based parasitics attributable to distance between the first and second types of FET circuits. This may be achieved, for example by minimizing the physical distance between the first type of FET and the second type of FET.

In certain example embodiments, aspects of the present disclosure are directed to a method and/or apparatus for and/or involving manufacture of a circuit benefitting from reduced gate loss in wide bandgap (WBG) power semiconductors. Such example embodiments may involve a circuit benefitting from reduced gate loss in wide bandgap power semiconductors, the circuit including a field-effect transistor (FET). Other aspects of the present disclosure involve a method and/or apparatus for and/or involving manufacture of a circuit benefitting from reduced gate loss in wide bandgap power semiconductors in a soft-switching turn-on transition, the circuit including a field-effect transistor (FET). Yet another aspect involves a method and/or apparatus for and/or involving manufacture of a circuit benefitting from reduced gate loss in wide bandgap power semiconductors in a hard-switching turn-on transition, the circuit including a field-effect transistor (FET).

In another specific example embodiment, the disclosure involves a method and/or apparatus for and/or involving manufacture of an integrated circuit benefitting from reduced gate loss in wide bandgap power semiconductors, the integrated circuit including a depletion mode silicon carbide (SiC) junction gate field-effect transistor (JFET) and an enhancement mode gallium nitride (GaN) high-electron-mobility transistor (HEMT).

The above discussion/summary is not intended to describe each embodiment or every implementation of the present disclosure. The figures and detailed description that follow also exemplify various embodiments.

BRIEF DESCRIPTION OF THE FIGURES

Various example embodiments may be more completely understood in consideration of the following detailed description which include examples in the form of proof-of-concept and/or experimental examples, and in connection with the drawings as shown in the Appendix of the underlying provisional application, and in the following drawings in which.

Figure 1:
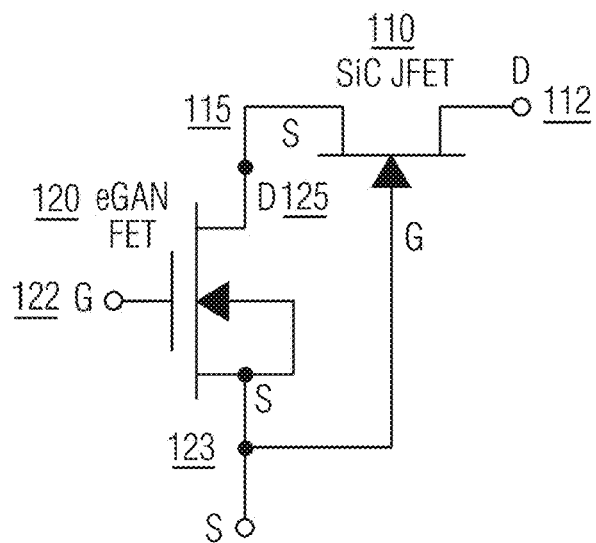
FIG. 1 depicts a schematic of an example of a circuit-based device, such as a power device, in accordance with an example embodiment of the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Further Discussion

Aspects of the present disclosure are believed to be applicable to a variety of different types of apparatuses, systems and methods involving gate loss in WBG power devices. Various example embodiments are directed to issues such as those addressed above and/or others which may become apparent from the following disclosure. Example embodiments, aspects of the present disclosure include a method and/or apparatus for and/or involving manufacture of a circuit benefitting from reduced gate loss in wide bandgap (WBG) power semiconductors. Such example embodiments may involve a circuit benefitting from reduced gate loss in wide bandgap power semiconductors, the circuit including a field-effect transistor (FET). Other aspects of the present disclosure involve a method and/or apparatus for and/or involving manufacture of a circuit benefitting from reduced gate loss in wide bandgap power semiconductors, the circuit including a junction gate field-effect transistor (JFET) and a high-electron-mobility transistor (HEMT). Yet other aspects of the present disclosure involve a method and/or apparatus for and/or involving manufacture of a circuit benefitting from reduced gate loss in wide bandgap power semiconductors, the circuit including a silicon carbide (SiC) junction gate field-effect transistor (JFET) and a gallium nitride (GaN) high-electron-mobility transistor (HEMT). Further aspects of the present disclosure involve a method and/or apparatus for and/or involving manufacture of a circuit benefitting from reduced gate loss in wide bandgap power semiconductors, the circuit including a depletion mode silicon carbide (SiC) junction gate field-effect transistor (JFET) and an enhancement mode gallium nitride (GaN) high-electron-mobility transistor (HEMT).

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

In specific examples according to the present disclosure, embodiments involve a switching circuit consisting of a first type of field effect transistor (FET) which is characterized as being normally-on and with a high-voltage rating. Also included is a second type of FET characterized as being a normally-off FET with a voltage rating that is less than an order of magnitude than the high-voltage rating of the first type of FET circuit. In the example, these two FET types can be configured in a cascode arrangement in which, in response to a switching control signal received by the second type of FET circuit, the second type of FET circuit is active to drive the first type of FET.

In a more specific example, the second type of FET circuit is to drive the first type of FET towards optimization of, or at least mitigate, power loss due to a gate loss associated with the first type of FET circuit. In a further example, the first type of FET circuit refers to or includes a FET having Silicon Carbide (SiC), and the second type of FET circuit refers to or includes a wide bandgap FET. The above described FETs may have, for example, a high-voltage rating within a range of a few hundred volts to a few kVolts for the first FET type, and the second type of FET circuit has a voltage rating of less than 650 Volts, or for example, the first type of FET may be constructed with Silicon Carbide (SiC), the second type of FET may be constructed with GalliumNitride (GaN), and the high-voltage rating of the first type of FET is within a range of a few hundred volts to a few kVolts.

Now, another example where the first type of FET circuit is further characterized in a switching-circuit operation as having a gate charge requirement for the switching-circuit operation that proportionately tracks, for a range of increasing frequencies of switching-circuit operation, with the gate loss.

Another specific example referring to the general construction of the device: The first type of FET is characterized as including an SiC layer, and the second type of FET includes a GaN layer that manifests a structural orientation corresponding to epitaxial growth of the GaN layer on the SiC layer.

A further specific example is of an integrated circuit chip including the two FETs as described above circuit integrated and configured to render, as being negligible, impedance-based parasitics. These parasitics can be attributed to the distance between the two FET circuits.

Now a more specific example describes use in a high-frequency switching power circuit. This circuit would include, but not limited to, a first type of field-effect transistor (FET) characterized as being a normally-on FET in a switching-circuit operation with a high-voltage rating, and a second type of FET characterized as being a normally-off (GaN) FET with a voltage rating that is less than an order of magnitude than the high-voltage rating of the first type of FET. These two FET types can be configured in a cascode arrangement in which, in response to a control signal received by the second type of FET circuit, the second type of FET circuit is to drive the first type of FET. This cascode arrangement may also include a circuit-based load, wirelessly or otherwise, to collect energy in response to the control signal causing the second type of FET circuit to activate and drive the first type of FET.

In another specific example and building on above examples, the second type of FET circuit is to drive the first type of FET towards optimization of, or at least mitigate, power loss due to a gate loss associated with the first type of FET circuit. Also first type of FET circuit refers to or includes a FET having Silicon Carbide (SiC), and the second type of FET circuit refers to or includes a wide bandgap FET. In this example the system further comprising an integrated circuit chip including the two described FETs integrated and configured to render as being negligible impedance-based parasitics attributable to distance between the two FET circuits.

A further example building on the examples above could be a circuit consisting of FETs of two different types. The first being a field-effect transistor (FET) characterized as being a normally-on FET in a switching-circuit operation with a high-voltage rating and the second FET being a normally-off (GaN) FET in a switching-circuit operation with a voltage rating that is less than an order of magnitude than the high-voltage rating of the first type of FET. This cascode circuit would be configured so as to cause, presenting a switching control signal to the second type of FET, the second FET to activate and drive the first FET. In such an arraignment for example, the second FET drives the first FET towards optimization of, or to at least mitigate, power loss due to a gate loss associated with the first type of FET. To achieve this optimization the first FET may be constructed, for example, having Silicon Carbide (SiC) and the second FET could be a wide bandgap FET. In the above cascode example, the high-voltage rating of the first FET could be within a range of a few hundred volts to a few kVolts, and the second FET could have a voltage rating of less than 650 Volts. As another specific example of the cascode circuit described above, first FET may be constructed having Silicon Carbide (SiC), the second FET may be constructed having GalliumNitride (GaN), and again the high-voltage rating of the first type of FET is within a range of a few hundred volts to a few kVolts.

A further example of the cascode circuit described above, first FET could be further characterized in a switching-circuit operation as having a gate charge requirement for the switching-circuit operation that proportionately tracks, for a range of increasing frequencies of switching-circuit operation, with the gate loss.

In a specific example of the construction of the FET based cascode circuit described above; the first FET can include an SiC layer, wherein the second FET can include a GaN layer manifesting a structural orientation corresponding to epitaxial growth of the GaN layer on the SiC layer. This arraignment can be constructed as an integrated circuit including the first FET and the second FET integrated so as to render negligible, impedance-based parasitics which are attributable to distance between the first and FET.

In other specific example embodiments, the disclosure involves a method and/or apparatus for and/or involving manufacture of a circuit benefitting from reduced gate loss in wide bandgap power semiconductors in a soft-switching turn-on transition, the circuit including a junction gate field-effect transistor (JFET) and a high-electron-mobility transistor (HEMT). Additional aspects of the present disclosure involve a method and/or apparatus for and/or involving manufacture of a circuit benefitting from reduced gate loss in wide bandgap power semiconductors in a hard-switching turn-on transition, the circuit including a junction gate field-effect transistor (JFET) and a high-electron-mobility transistor (HEMT). Further example embodiments involve a method and/or apparatus for and/or involving manufacture of a circuit benefitting from reduced gate loss in wide bandgap power semiconductors in a soft-switching turn-on transition, the circuit including a depletion mode silicon carbide (SiC) junction gate field-effect transistor (JFET) and an enhancement mode gallium nitride (GaN) high-electron-mobility transistor (HEMT). Still further aspects of the present disclosure involve a method and/or apparatus for and/or involving manufacture of a circuit benefitting from reduced gate loss in wide bandgap power semiconductors in a hard-switching turn-on transition, the circuit including a depletion mode silicon carbide (SiC) junction gate field-effect transistor (JFET) and an enhancement mode gallium nitride (GaN) high-electron-mobility transistor (HEMT).

In another specific example embodiment, the disclosure involves a method and/or apparatus for and/or involving manufacture of an integrated circuit for benefitting from reduced gate loss in wide bandgap power semiconductors, the integrated circuit including a depletion mode silicon carbide (SiC) junction gate field-effect transistor (JFET) and an enhancement mode gallium nitride (GaN) high-electron-mobility transistor (HEMT). Although this specific example embodiment discloses components or devices, such as a SiC JFET and a GaN HEMT, in the circuit, other components or devices that may perform the same or similar functions are also contemplated.

While not necessarily so limited, various aspects may be appreciated through the following discussion of non-limiting examples which use exemplary contexts.

WBG power semiconductors, such as GaN and SiC devices have high critical fields and high thermal conductivity that make such devices good candidates for efficient high-voltage and high-frequency operations. SiC devices are especially suitable for high-voltage applications because their vertical structures allow them to have higher voltage blocking capability. However, SiC devices have large gate charge, which results in high gate loss at high frequencies. Gate drivers for SiC devices are usually bulky and power-hungry. Previous research has demonstrated using resonant gate drivers to reduce gate loss of SiC devices. However, resonant gate drivers require additional components, increasing the complexity of the circuit. Various example embodiments describe a method to reduce gate loss in WBG power semiconductors.

A device's gate loss may be proportional to its gate charge, gate voltage, and switching frequency. Various example embodiments may demonstrate that driving a SiC JFET with a GaN FET, in a cascode arrangement, may completely eliminate the SiC JFET gate loss in a soft-switching case and may reduce its gate loss by half in a hard-switching case when its gate resistance is negligible. During turn-off transitions, the device capacitances are charged by the current, and this process may be lossless. Similarly, the soft-switching turn-on transitions may also be lossless. In hard-switching turn-on transitions, the device capacitances are discharged through the GaN FET channel, which may result in half of the switching loss.

Various example embodiments of a method of reducing gate loss in WBG power semiconductors may be applied to many high-frequency and high-power applications, such as, e.g., wireless power transfer applications, radio-frequency plasma generations, etc. Because of reduction in device gate loss, higher current may be applied through the device with the same thermal limit, which may increase the power density of the power electronics system.

In more specific embodiments and also as more specifically exemplified in connection with the specific disclosures in the accompanying Appendix, there are many features (or aspects) of the instant disclosure. The follow are examples of such features and the skilled artisan would appreciate that these features can be used together in any of various combinations and/or as independently such as described herein and in the Appendix.

Various example embodiments may include a cascode GaN/SiC power device, which may combine the benefits of a GaN device's fast switching ability, and a SiC device's high voltage blocking capability and low $C_{oss}$ losses at high frequencies. Such a cascode device may consist of a depletion-mode SiC junction gate field-effect transistor (JFET) and an enhancement-mode GaN (eGaN) HEMT. The cascode device may use the same simple and low-power gate driver as GaN HEMTs, which may greatly reduce the complexity and board area usage of the auxiliary gate drive circuitry for SiC devices. Detailed gate loss analysis evidences the cascode device types, according to the present disclosure, provide may be implemented to benefit by mitigating significantly or completely eliminating the gate loss of the SiC JFET with a negligible $R_{g,Jfet}$. In one such example, the cascode GaN/SiC device blocks 1 kV and may achieve 91% efficiency in a 13.56 MHz, 700 W Class E inverter. The performance of three Class E inverters using a SiC MOSFET, SiC JFET, and the cascode GaN/SiC as the switching device, respectively, may indicate that the cascode GaN/SiC device has a much simpler gate drive design which may require much smaller area on the board while achieving the highest efficiency. The integrated cascode GaN/SiC device may have reduced threshold voltage drift, better heat removal capability, and reduced parasitic impedances.

Various example embodiments may include a cascode GaN/SiC power device, which may include two commercially available devices, such as: a depletion-mode 1200 V SiC JFET (UJN1208K) and an enhancement-mode 100 V GaN HEMT (EPC2045). Table I lists possible device parameters of the two FETs.

TABLE I

Device Parameters of the SiC JFET and GaN FET.

| Device | Part Number | Package | $R_{ds,on}$ [mΩ] | $C_{oss}$ [pF] | $Q_G$ [nC] | $V_{DS}$ [V] |
|---|---|---|---|---|---|---|
| SiC JFET | UJN1208K | TO247 | 77 | 42 | 62 ($V_{DS}$ = 600 V, $V_{GS}$ = 15.5 V) | 1200 |
| eGaN FET | EPC2045 | die | 5.6 | 260 | 5.2 ($V_{DS}$ = 50 V, $V_{GS}$ = 5 V) | 100 |

SiC JFETs may have more stable device threshold voltages than SiC MOSFETs. SiC MOSFETs may have more interface trap charges than Si MOSFETs, because the SiC/SiO$_2$ interface may have more crystal defects than the Si/SiO$_2$ interface. Such trap charges may impact channel carrier mobility and subthreshold slope, which may lead to variations in device threshold voltage. Unlike SiC MOSFETs, SiC JFETs do not have a SiC/SiO$_2$ interface and theoretically may avoid this problem. Since most of the drain-to-source voltage may be blocked by the SiC JFET in the cascode device, the GaN HEMT may be chosen with moderate voltage rating, small gate charge and low on-resistance. FIG. 1 shows a schematic of an example cascode GaN/SiC power device, in accordance with an example embodiment of the present disclosure. The source 115 of the SiC JFET 110 is shown connected to the drain 125 of the GaN FET 120 and the gate 122 of the SiC JFET 110 is shown connected to the source 123 of the GaN FET 120. The cascode device may be able to be driven easily at high frequencies by only driving the GaN FET 120. The voltage blocking capability of the cascode device may be similar to that of the SiC JFET 110 and may be explained by the switching sequence described below.

Figure 2A:
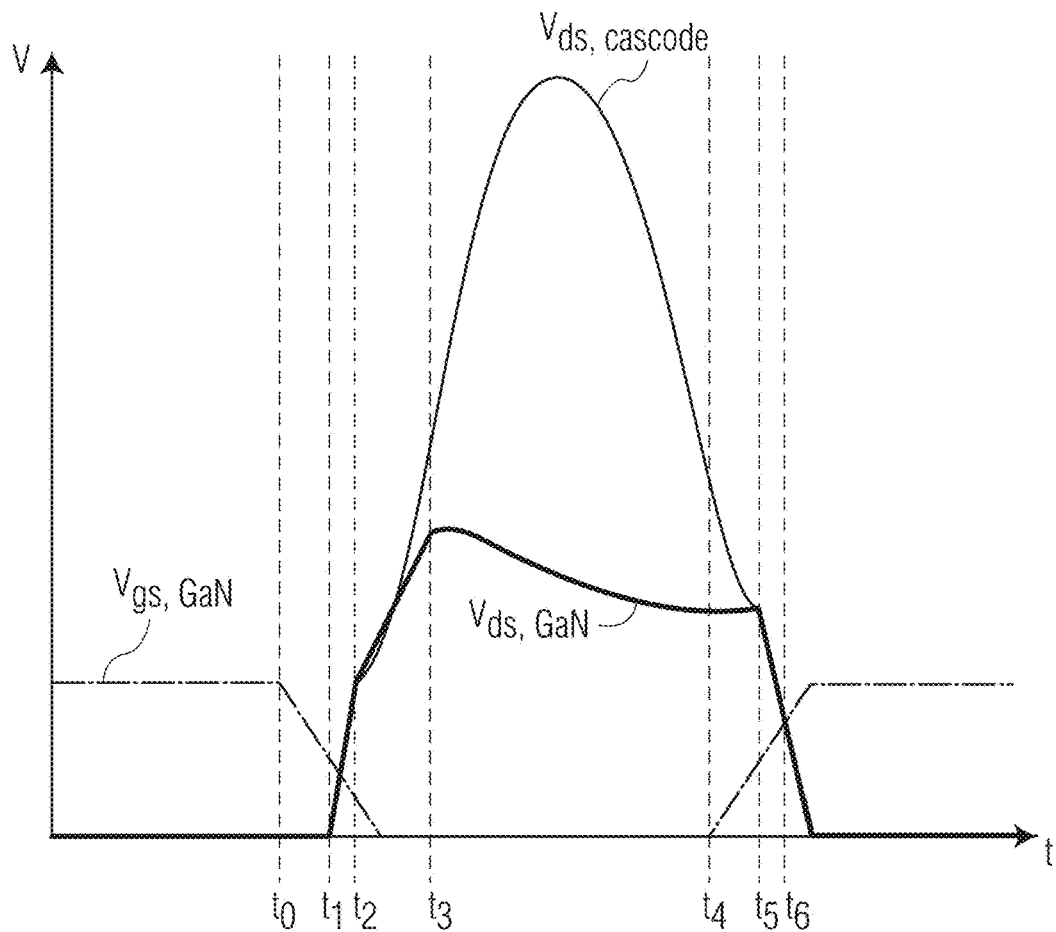
FIG. 2A depicts a graph of an example of a switching sequence of a device such as in FIG. 1, using the example of a cascode GaN/SiC device in a Class E inverter with a hard-switching turn-on, in accordance with an example embodiment of the present disclosure.
Figure 2B:
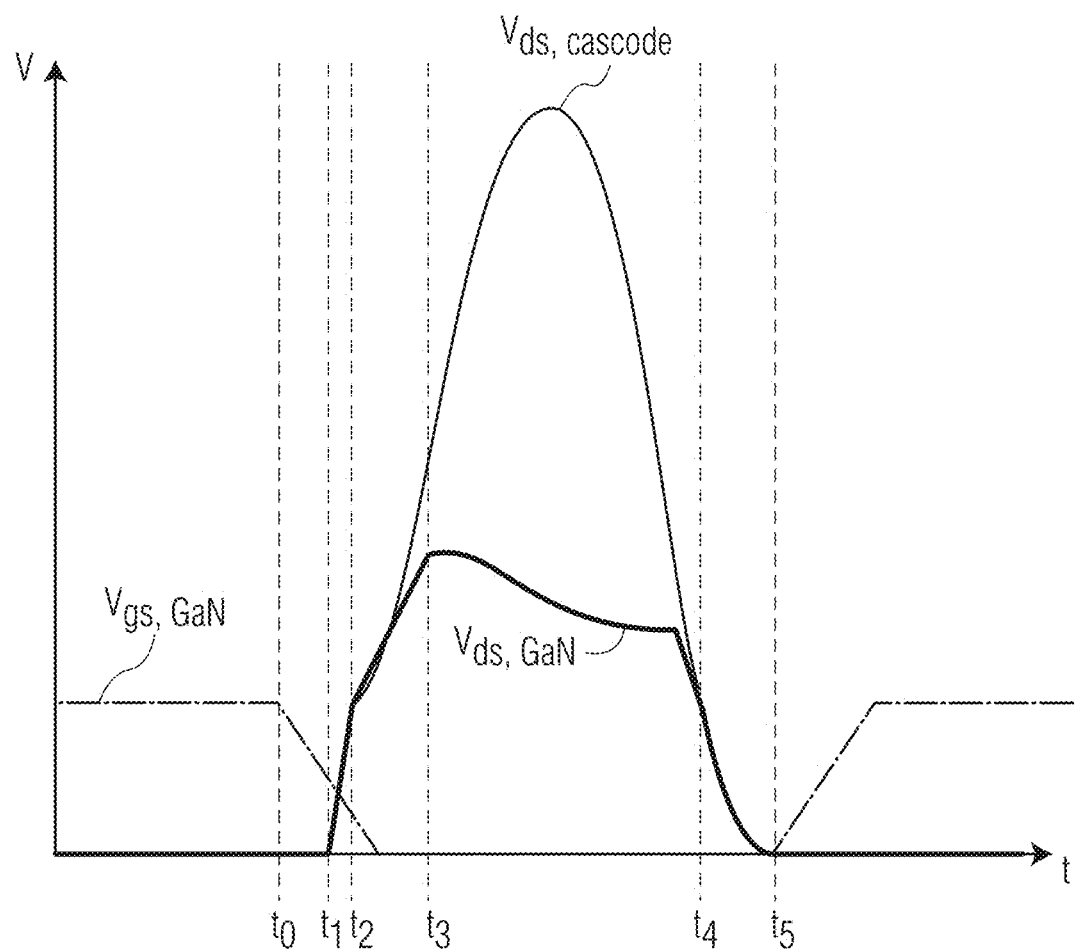
FIG. 2B depicts a graph of an example of a switching sequence of a cascode GaN/SiC device in a Class E inverter with a soft-switching turn-on, as related to FIG. 2A and in accordance with an example embodiment of the present disclosure.
Figure 3:
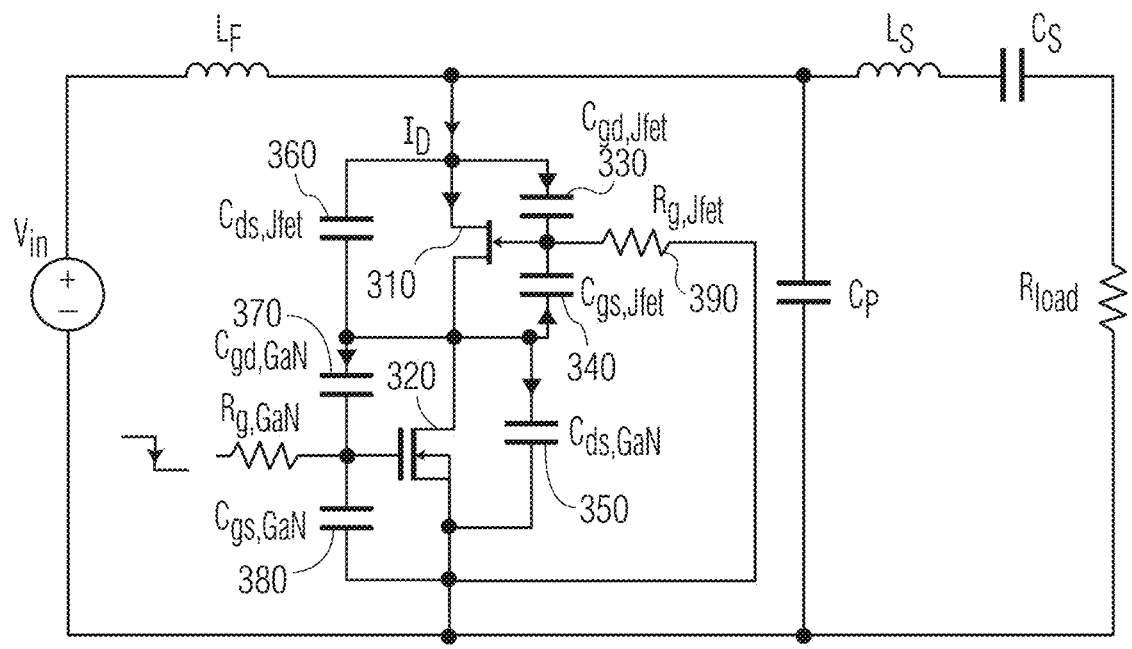
FIG. 3 depicts a schematic example of turn-off behavior of the above example device, in accordance with an example embodiment of the present disclosure.

FIGS. 2A and 2B show an example switching sequence of the cascode GaN/SiC device (FIG. 1) in a Class E inverter. FIG. 2A shows a hard-switching turn-on and FIG. 2B shows a soft-switching turn-on. At $t_0$, the gate of the GaN FET 320 is switched from high to low. At $t_1$, the GaN FET 320 is turned off, and its drain voltage starts to rise. From $t_1$ to $t_2$, the GaN FET 320 is off while the SiC JFET 310 is still on. FIG. 3 illustrates the equivalent circuit during this period. That is, FIG. 3 depicts a schematic example of turn-off behavior of the SiC JFET 310 right after turning off the GaN FET 320. The positive drain current ($I_D$) flows through the SiC JFET 310 and charges $C_{iss}$ of the JFET 310 ($C_{iss}$=$C_{gd}$330+$C_{gs}$340) and $C_{oss}$ of the GaN FET 320 ($C_{oss}$=$C_{gd}$370+$C_{ds}$ 350) until $V_{gs}$ of the SiC JFET 310 reaches its threshold voltage (−7 V for UJN1208K) at t2 (From t2 to t3, the SiC JFET 310 is turned off, and ID continues to charge $C_{ds,Jfet}$ 360 in series of $C_{oss}$,$G_{aN}$ and $C_{gs,Jfet}$ 340, where Ciss refers to input capacitance. At the same time, ID is also charging $C_{gd,Jfet}$ 330, but this charging path does not affect the voltage distribution between the SiC JFET 310 and GaN FET 320. The maximum drain voltage of the GaN FET 320 in each turn-off switching process is determined by the capacitance ratio of the two FETs. The voltage blocking capability of the cascode GaN/SiC device is similar to that of the SiC JFET 310, which is measured to be higher than 1.2 kV.

Figure 4:
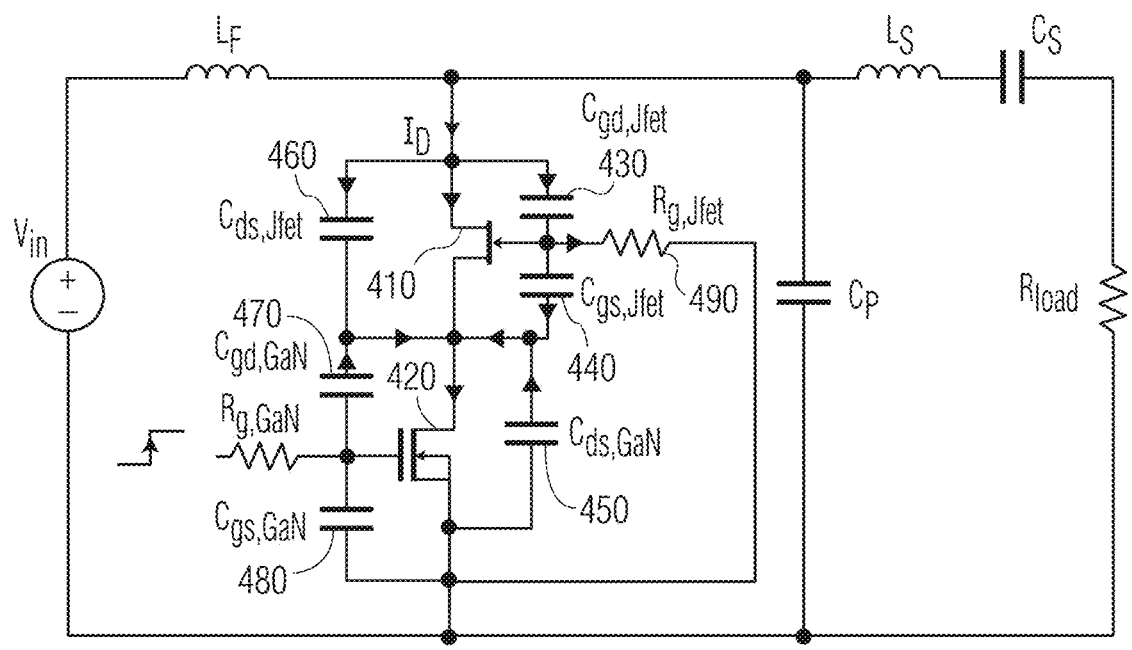
FIG. 4 depicts a schematic example of turn-on behavior of an example cascode device in a Class E inverter, in accordance with an example embodiment of the present disclosure.

In an event of hard-switching turn-on (FIG. 2A), the gate signal at $t_4$ may be applied, and the GaN FET 420 may be turned on first while the SiC JFET 410 remains off ($t_5$). FIG. 4 depicts this example of turn-on behavior of an example cascode device in a Class E inverter right after turning on the GaN FET 420. Once the GaN FET 420 is on, all of the capacitors at its drain node (which is also the source node of the SiC JFET 410) will start discharging through the channel of the GaN FET (FIG. 4). The SiC JFET 410 will be turned on when its $V_{gs}$ is greater than the threshold voltage. Then the source node of SiC JFET will continue to discharge until it reaches 0 V (FIG. 4b).

If $I_D$ in FIG. 4 is negative, it is possible to turn on the cascode device by ZVS (FIG. 2B). The negative ID helps to discharge the capacitors at the drain node of the GaN FET 420 before the gate signal is applied. At $t_4$, $V_{ds,GaN}$ decreases to the threshold voltage of the SiC JFET 410, and the JFET will be turned on by ZVS. The GaN FET 420 will be turned on at $t_5$.

Generally, gate loss of a SiC device is quite high (tens of watts) in HF and VHF power circuits, and it is determined by device gate charge and gate voltage. However, the gate loss mechanism in the example embodiment cascode GaN/SiC device disclosed herein may be different. Theoretically, the SiC JFET in the cascode device disclosed herein may have zero gate loss in a soft-switching case.

As illustrated in FIG. 3, during the turn-off process, $C_{oss}$ of the GaN FET 320 and all of the SiC JFET 310 capacitors are charged by $I_D$. In an ideal case of zero $R_{g,Jfet}$, there will be no gate power loss in the turn-off process. With a non-zero $R_{g,Jfet}$ 390, the gate power loss of the SiC JFET 310 is:

$$P_{JFETgate,turn-off} = |i_{Rg,Jfet}(t)|^2_{RMS} R_{g,Jfet} \quad (1)$$

When the cascode device is turned on by hard-switching (ID is positive), all of the charges at the drain node of the GaN FET 320 ($Q_{drain,GaN}$) will be dumped through the GaN FET 320 channel (FIG. 4). Therefore, the SiC JFET 310 will have gate loss of:

$$P_{JFETgate,turn-on} = \frac{1}{2}Q_{drain,GaN} \cdot V_{drain,GaN} \cdot f_s + |i_{Rg,Jfet}(t)^2_{RMS}| \cdot R_{g,Jfet} \quad (2)$$

If the cascode device is turned on by ZVS ($I_D$ is negative), the capacitors at the drain node of the GaN FET can be discharged by $I_D$ before the device is turned on. As a result, there will be no gate power loss for the SiC JFET with a zero $R_{g\_Jfet}$ 390. When $R_{g\_Jfet}$ 390 is non-zero, the SiC JFET 310 will have a turn-on loss similar to Equation 1. Therefore, in a soft-switching case, the SiC JFET 310 gating loss may, for example, be completely eliminated in the cascode device if $R_{g\_Jfet}$ 390 is negligible, while in a hard-switching case, SiC JFET 310 gating loss may be reduced by half, for example.

For another perspective of FIGS. 3 and 4, showing different states of operation and/or flow of current, reference may be made to FIGS. 3a-3b and 4a-4b of the Appendix of the Provisional Application to which priority is claimed and which is entitled: "Cascode GaN/SiC: A Wide-Bandgap Heterogenous Power Device for High-Frequency Applications."

Before using the cascode GaN/SiC device in power converters, the output capacitance ($C_{oss}$) was measured. $C_{oss}$ is an important parameter when designing HF and VHF inverters because it determines the ranges of possible operating frequencies and power levels.

Figure 5:
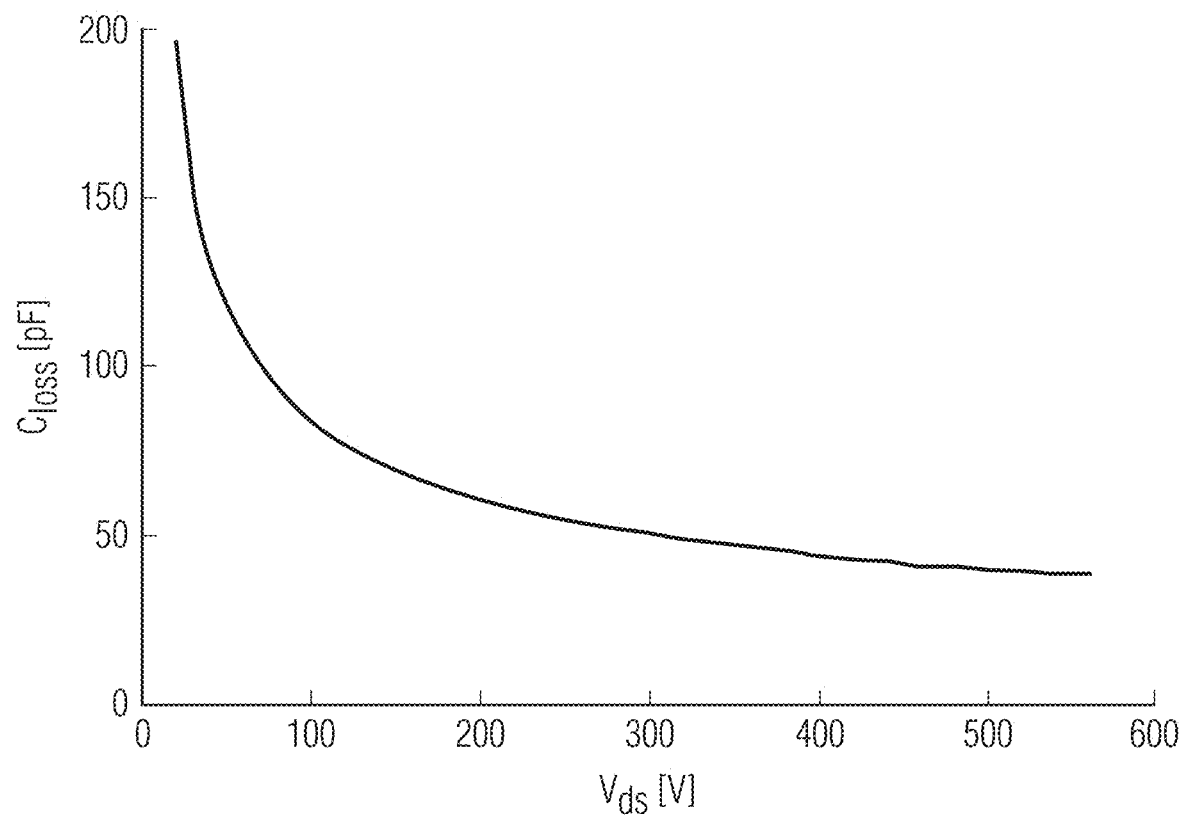
FIG. 5 depicts measured small signal $C_{oss}$ of the cascode GaN/SiC device at 1 MHz from 0 V to 560 V, in accordance with an example embodiment of the present disclosure.

FIG. 5 shows the small signal $C_{oss}$ of the cascode GaN/SiC device measured using an impedance analyzer (e.g., E5061B from Keysight Technologies). $C_{oss}$ was measured at 1 MHz with the bias voltage being swept from 0 V to 560 V. No measurements were taken above 560 V due to limitation of the available DC power supply. The small signal $C_{oss}$ of this cascode device is 40 pF at 500 V.

Figure 6:
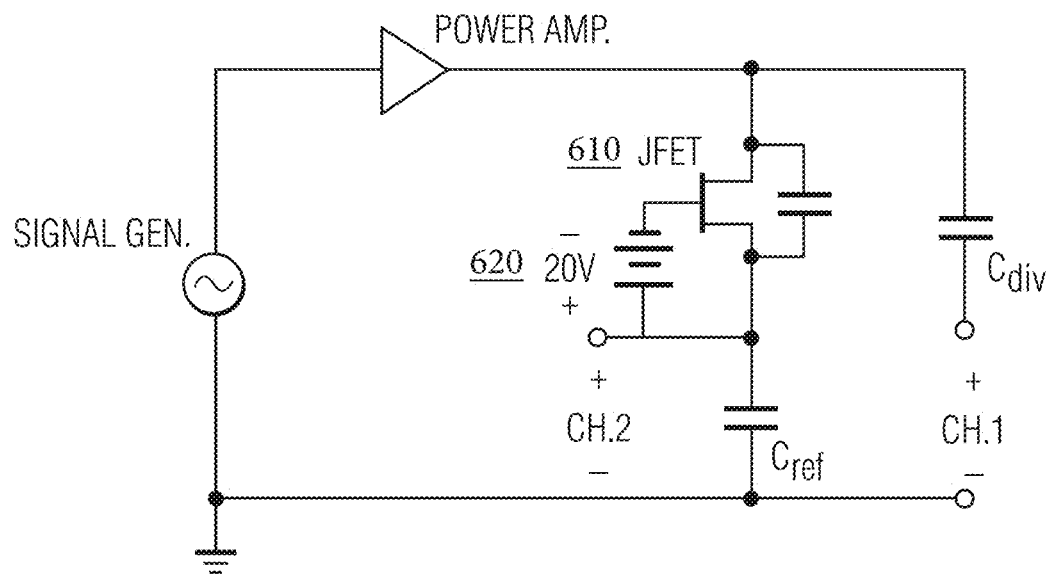
FIG. 6 depicts a Sawyer-Tower test circuit for measuring the $C_{oss}$ energy loss of the SiC JFET, using batteries to apply a constant voltage of −20 V to $V_{GS}$ of the JFET to keep it turned off, in accordance with an example embodiment of the present disclosure.
Figure 7A:
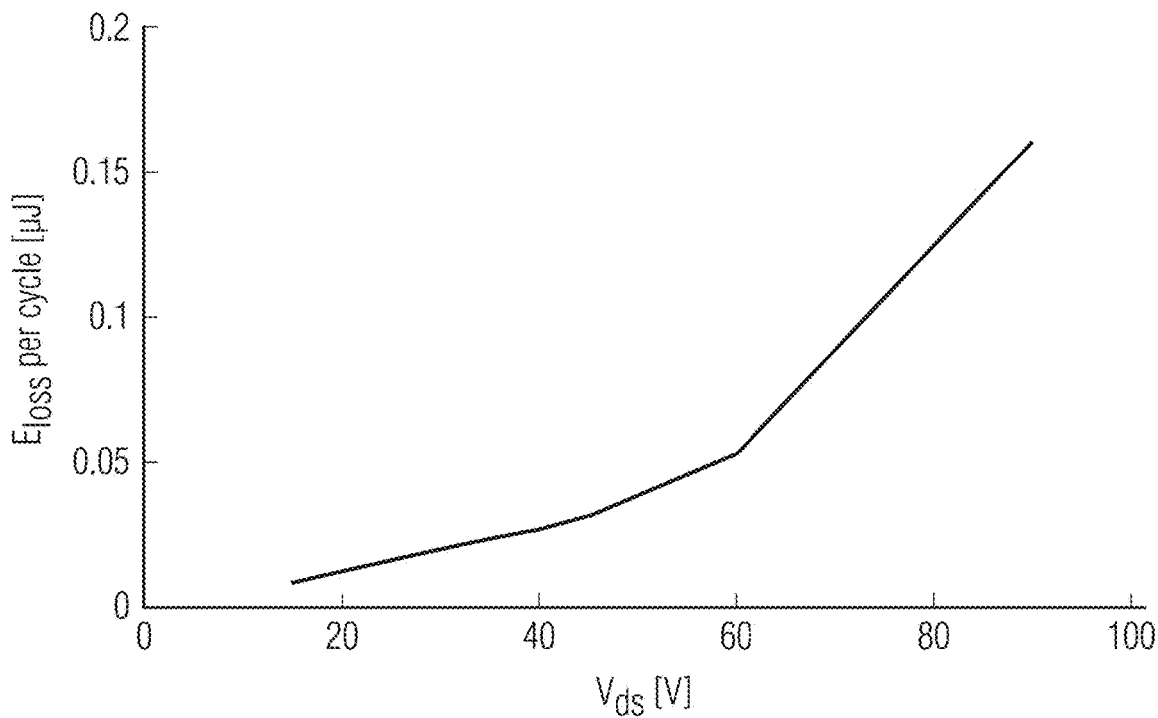
FIG. 7A depicts measured $C_{oss}$ energy loss per cycle at 13.56 MHz of the GaN FET using Sawyer-Tower tests, in accordance with an example embodiment of the present disclosure.
Figure 7B:
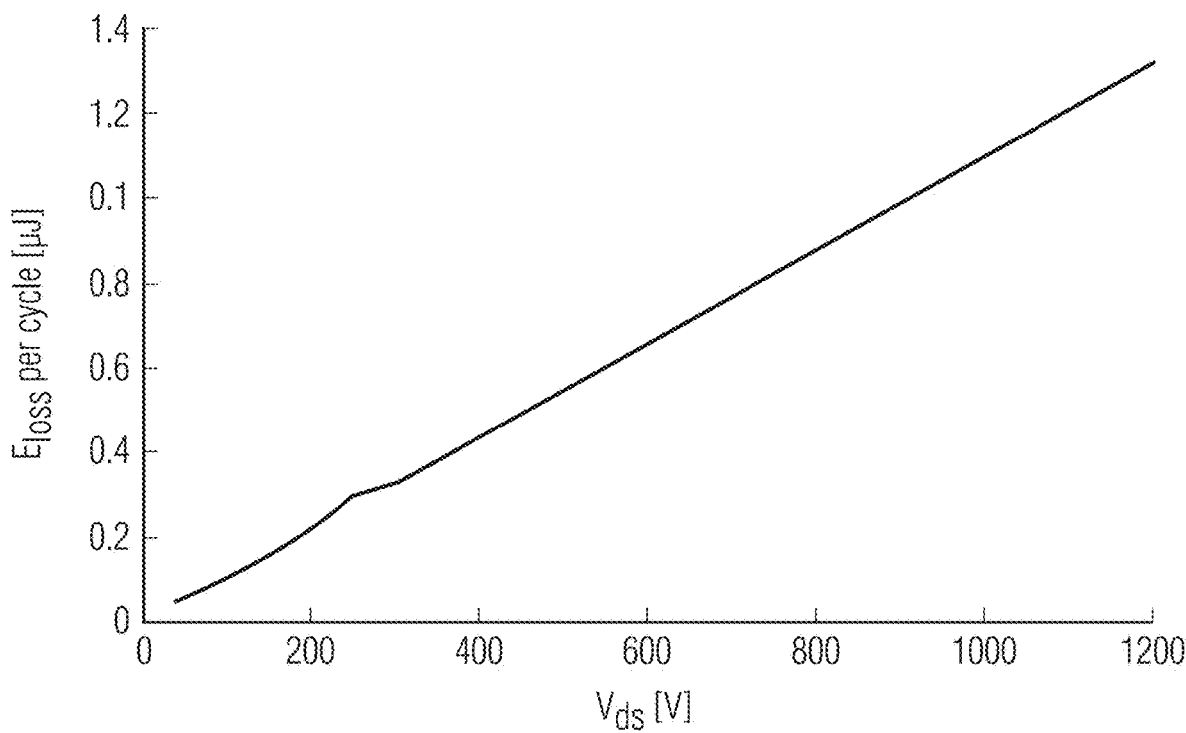
FIG. 7B depicts measured $C_{oss}$ energy loss per cycle at 13.56 MHz of the SiC JFET using Sawyer-Tower tests, in accordance with an example embodiment of the present disclosure.

As mentioned above, $C_{oss}$ energy loss is not part of simulation models provided by manufacturers, but it contributes a significant portion to the total device switching loss in high-frequency and high-voltage applications. Using the Sawyer-Tower test Coss energy loss of the GaN FET (EPC2045) and the SiC JFET 610 (UJN1209K) (FIG. 6) was measured separately at 13.56 MHz. $C_{oss}$ energy loss of the cascode GaN/SiC device was not measured in a single test, because in that case, thermal measurements could also capture the gating loss of the SiC JFET. To ensure the SiC JFET 610 was kept off during the test, batteries 620 were used to apply a constant voltage of –20 V to its VGS (FIG. 6). FIGS. 7A and 7B show the measured $C_{oss}$ energy loss for EPC2045 (GaN FET) and UJN1208K (SiC JFET) respectively. In FIG. 7B, measured data were extrapolated using Equation 3, which is similar to the Steinmetz equation, to predict energy loss across all device operating voltages:

$$E_{diss} = k \cdot V_{ds}^{\alpha} \quad (3)$$

From FIGS. 7A and 7B, $C_{oss}$ power dissipation of the cascode GaN/SiC device at 13.56 MHz with VDS=1000 V was estimated at 15 W.

Figure 8A:
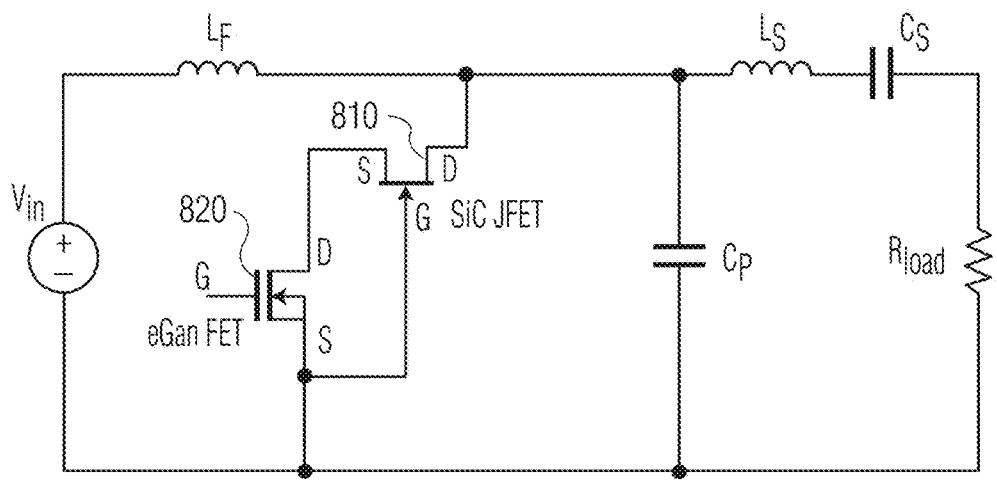
FIG. 8A depicts a schematic of the Class E inverter using the cascode GaN/SiC device, in accordance with an example embodiment of the present disclosure.
Figure 8B:
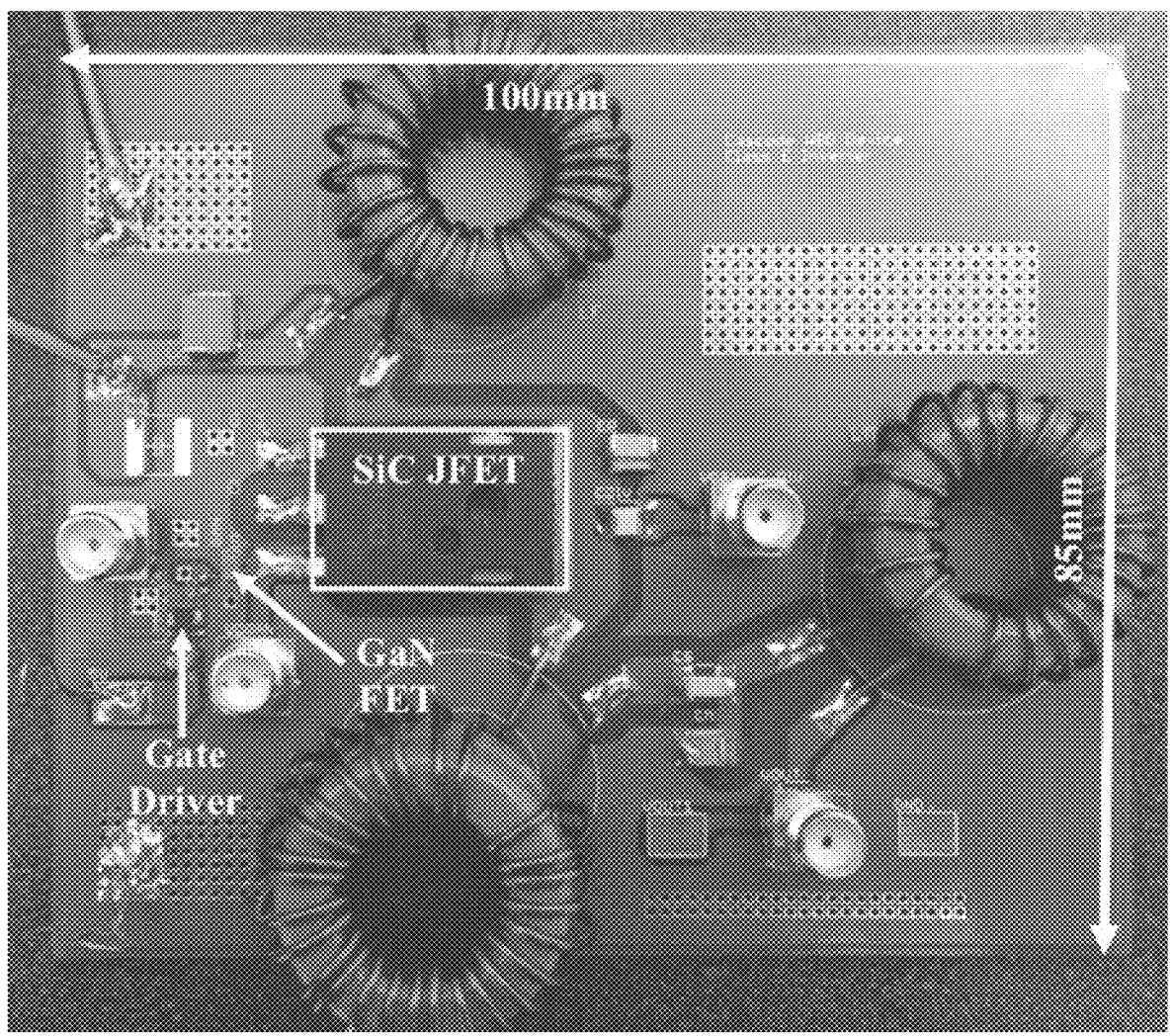
FIG. 8B depicts a PCB of the Class E inverter using the cascode GaN/SiC device, in accordance with an example embodiment of the present disclosure.

After analyzing the cascode GaN/SiC power device, its performance was tested in a Class E inverter. A 13.56 MHz 700 W Class E inverter was designed and implemented that has a maximum drain voltage of about 1 kV. The schematic and PCB of the Class E inverter are shown in FIGS. 8A and 8B respectively. The measured output power is 718 W with 91.1% efficiency at 200 V input.

Figure 9:
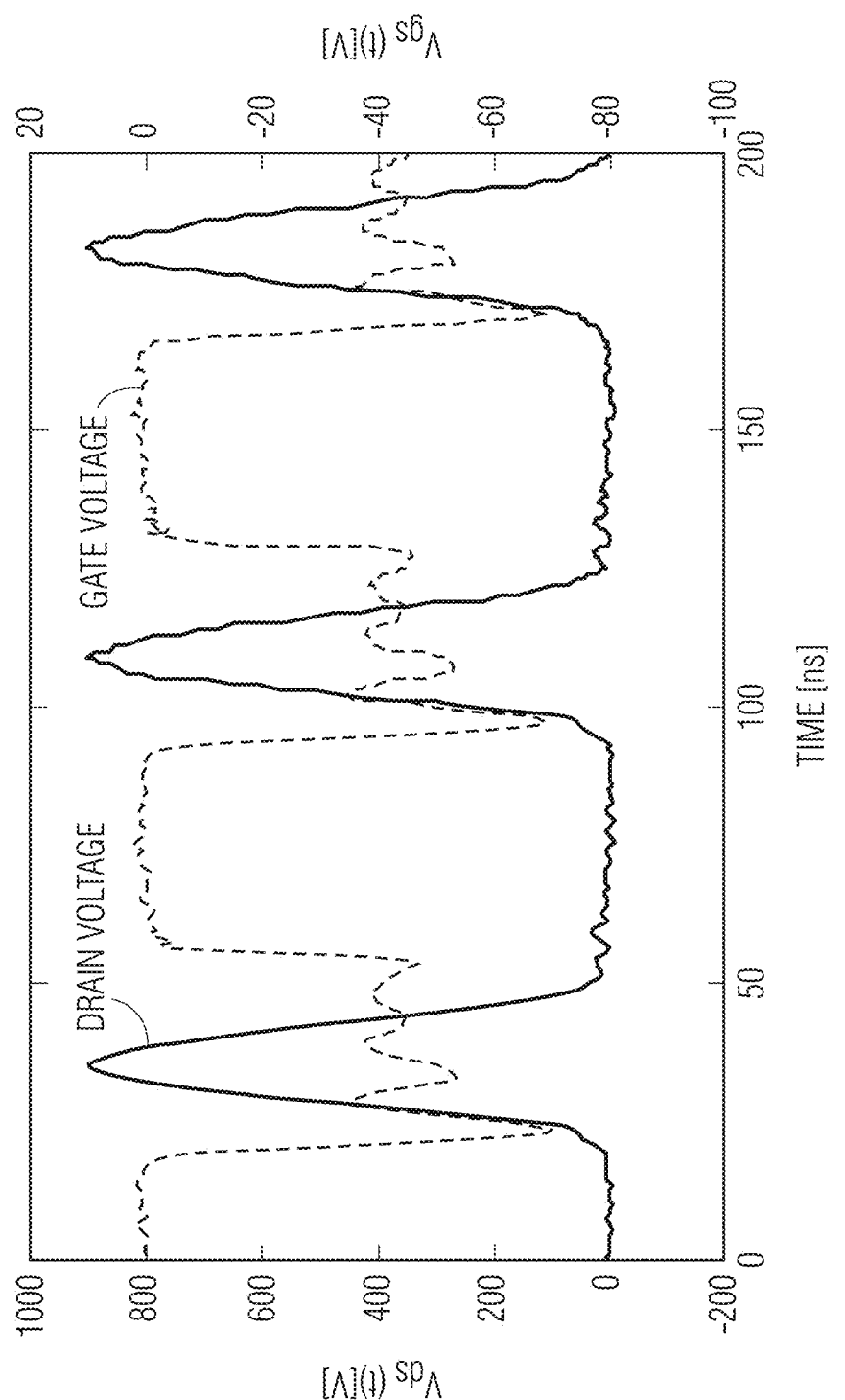
FIG. 9 depicts measured drain voltage and gate-to-source voltage waveforms of the SiC JFET in the cascode device, in accordance with an example embodiment of the present disclosure.

FIG. 9 shows the measured waveforms of the drain voltage and gate-to-source voltage $V_{gs}(t)$ of the SiC JFET 810 in the cascode device. $V_{gs}(t)$ of the SiC JFET 810 is also the inverse of $V_{ds}(t)$ of the GaN FET 820. The duty cycle is 50%. The measured maximum of the SiC JFET 810 drain voltage is 998 V and $V_{gs}(t)$ is 0 V to –40 V. The oscillations in $V_{gs}(t)$ at each turn-off transition are caused by the parasitic inductance of the SiC JFET 810 and PCB. The measured $V_{gs}$ exceeds gate voltage rating of the SiC JFET 810 (–20 V). However, it may actually be beneficial to drive the SiC JFET 810 using a larger swing of gate voltage. From the waveforms, when the JFET 810 is turned on ($V_{gs}$=0 V), the $V_{Drain}$ is approximately 0 V. This means that the device is operating under ZVS. In this circuit, a 5 V low-power gate driver (LM5114) was used to drive the cascode GaN/SiC device. The gate driver consumes only 558 mW at 13.56 MHz.

Two Class E inverters were built using a SiC MOSFET and a SiC JFET as the switching devices, and their performances were compared. The SiC MOSFET and SiC JFET that were chosen have similar voltage ratings and $R_{ds,on}$ values as the cascode device. The GaN devices were not compared because of the limitations on their voltage ratings. Table II below lists the parameters of these three switches based on device datasheets.

The $C_{oss}$ value of the cascode device in the Table II is based on the small signal

TABLE II

Device Parameters of SiC MOSFET, SiC JFET, and Cascode GaN/SiC Device.

| Device | Part Number | $V_{ds}$ [V] | $R_{ds,on}$ [mΩ] | $C_{iss}$ [pF] | $C_{oss}$ at $V_{ds}$ = 500 V [pF] | $V_{gs}$ [V] |
|---|---|---|---|---|---|---|
| SiC MOSFET | C2M0080120D | 1200 | 80 | 950 | 85 | 0 to 20 |
| SiC JFET | UJN1208K | 1200 | 77 | 450 | 42 | –20 to 0 |
| Cascode GaN/SiC Device | EPC2045 + UJN1208K | 1240 | 84 | 570 | 40 | 0 to 5 | measurement above, which is 40 pF at 500 V. In real circuit operations, most of the drain voltage is across the SiC JFET, which means most of the $C_{oss}$ loss comes from the cascoded SiC JFET. The $C_{iss}$ of the cascode device listed in Table II is the $C_{iss}$ of the GaN FET. Since the GaN FET has such low gate drive voltage, the gate loss of the cascode device may be very low compared to the other two devices. However, the cascode device may still have gate loss. Besides the potential reduction of gate loss in the cascode device, there is a significant difference in the source of the SiC JFET gating power. When using a SiC JFET alone, the gate driver needs to provide sufficient power to drive the JFET. When using a cascode device, the gate driver only needs to drive the GaN FET, while the circuit's main supply is providing power to drive the SiC JFET because the gate of the SiC JFET is connected to the circuit's main ground. Since a high-power gate driver is not needed for the cascode device, the auxiliary gate drive circuitry will be much easier to design and may occupy less board area.

Figure 10A:
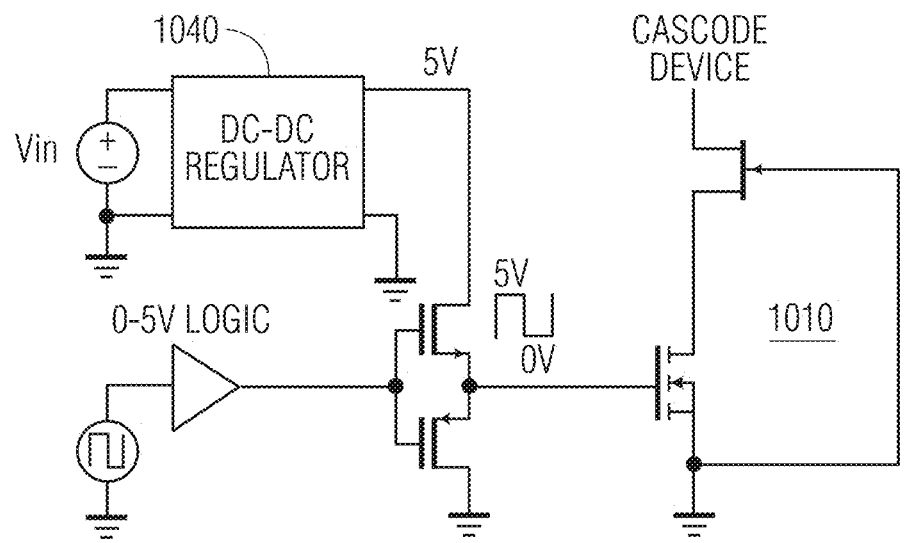
FIG. 10A depicts auxiliary gate drive circuitry of the cascode GaN/SiC device, in accordance with an example embodiment of the present disclosure.
Figure 10B:
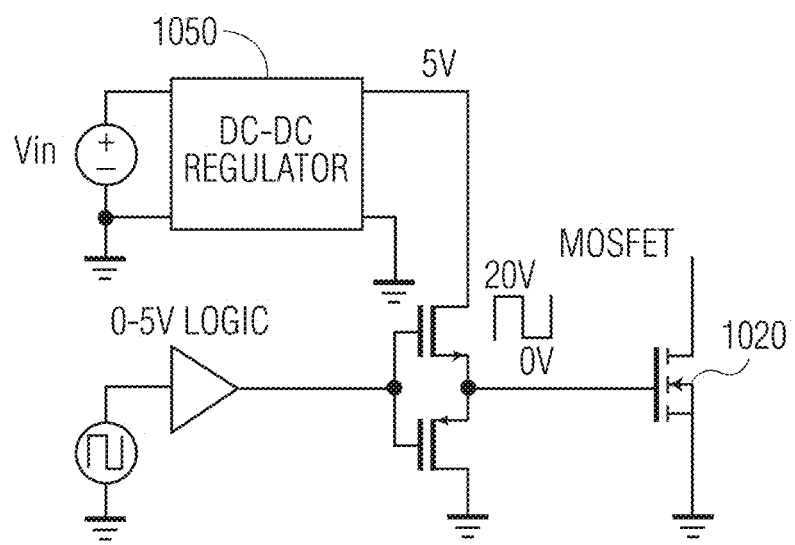
FIG. 10B depicts auxiliary gate drive circuitry of an exemplary SiC MOSFET device, in accordance with an example and experiment of the present disclosure.
Figure 10C:
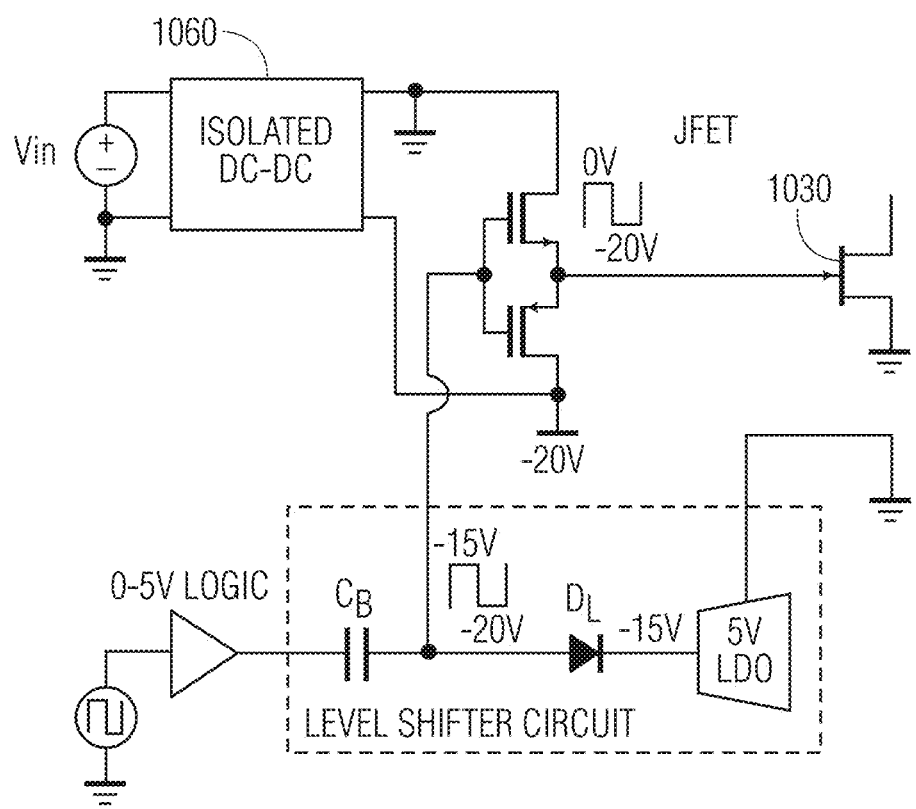
FIG. 10C depicts auxiliary gate drive circuitry of the SiC JFET device, in accordance with an example embodiment of the present disclosure.

After selecting the devices to compare, another two Class E inverters were built using the same specifications. Although the sizes of all passive components and active switches are quite similar in all three inverters, the complexity of their auxiliary gate drive circuits differ significantly. FIGS. 10A, 10B, and 10C show the schematics of the three gate drive circuits for the cascode GaN/SiC 1010 device, SiC MOSFET 1020, and SiC JFET1030. To generate the supply voltage for the gate driver, a dc-dc regulator (1040, 1050 and 1060) was used to convert the circuit's input voltage to the corresponding gate voltage in each case. The cascode GaN/SiC 1010 device only requires less than 1 W from a 5 V gate driver, while the SiC MOSFET 1020 and SiC JFET 1030 need 40 W from a 20 V gate driver and 20

W from a −20 V gate driver, respectively. As a result, the auxiliary gate drive circuit for the cascode device is the simplest and smallest among the three. Although both of the gate drive circuits for the SiC MOSFET 1020 and SiC JFET 1030 need to provide tens of watts, the one for the SiC MOSFET 1020 is much simpler because it does not require negative gate voltage. As shown in FIG. 10C, when driving a SiC JFET 1030, an isolated DC-DC converter 1060 should be used to output −20 V and a level shifter to generate −20 V to −15 V gate signal feeding into its gate driver.

Figure 11A:
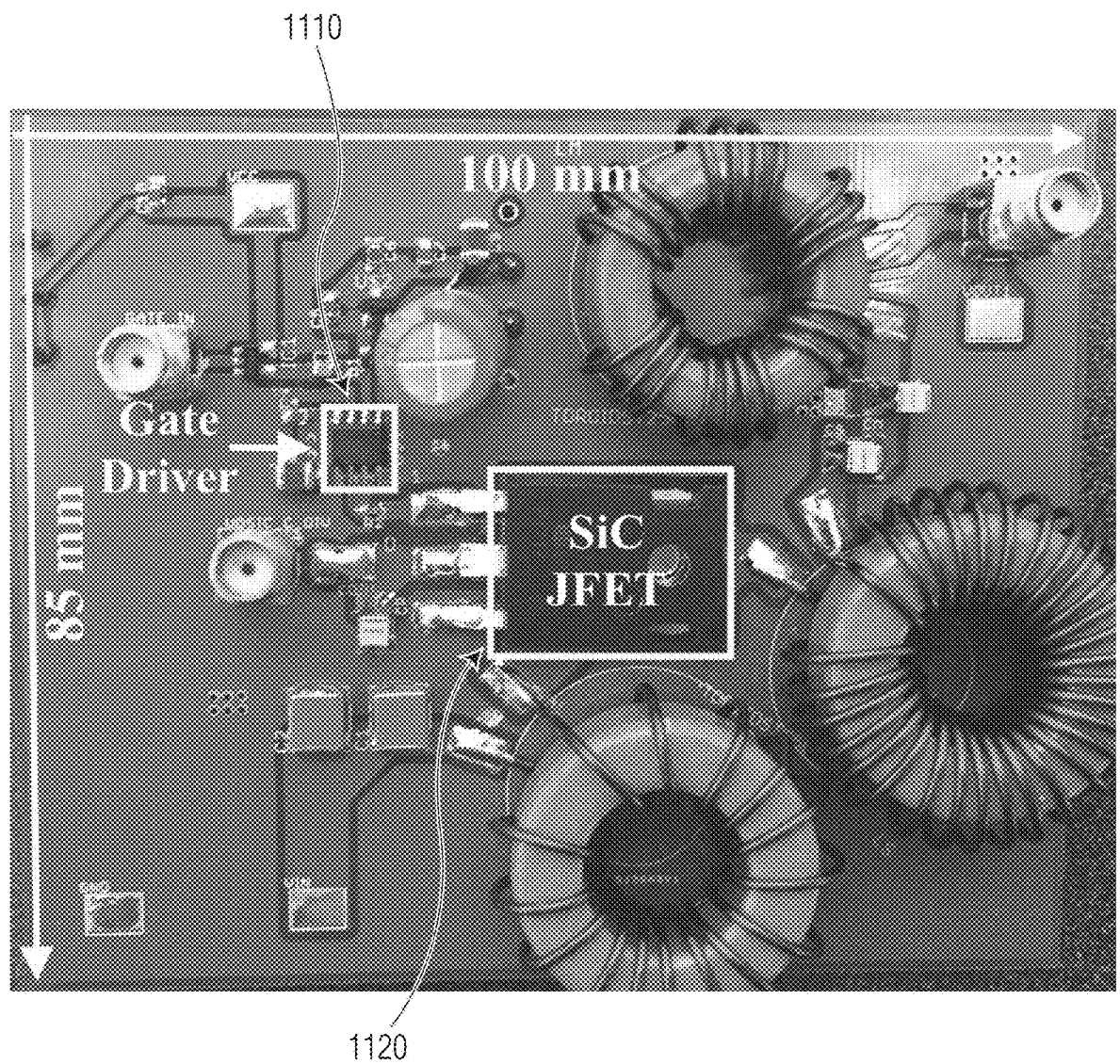
FIG. 11A depicts a PCB top view of a Class E inverter using a SiC JFET, in accordance with an example embodiment of the present disclosure.
Figure 11B:
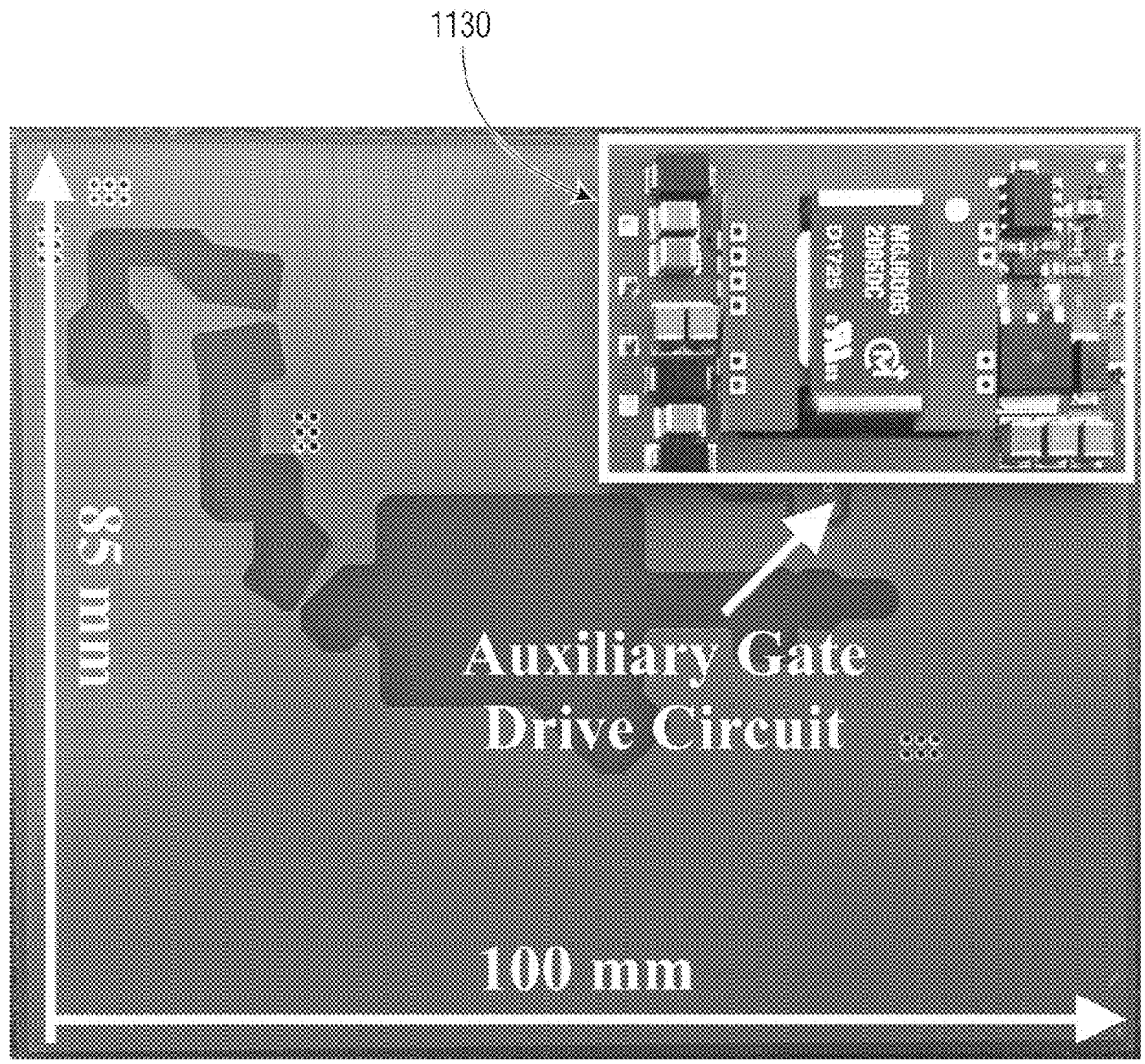
FIG. 11B depicts a PCB bottom view of a Class E inverter using a SiC JFET, in accordance with an example embodiment of the present disclosure.

FIG. 11A shows the PCB, top and bottom respectively, of the Class E inverter using the SiC JFET. Comparing with the inverter using the cascode GaN/SiC device in FIG. 8B, it is shown that not only the gate driver IC 1110 for SiC JFET 1120 is larger than the total volume of the GaN FET and the gate driver IC in the cascode device 1130, but its gate drive circuit is much more complicated and occupies larger board area (FIG. 11B). To quantify the benefits in gate drive circuitry of the cascode GaN/SiC device, Table III below compares gate drive cost and weight of the SiC JFET with those of the cascode device. As shown, both the weight and cost of the gate drive for the cascode device is much lower than that of the SiC JFET. Even if the GaN FET is considered as part of the gate drive for the cascode device, the total weight is still less than 0.1 g and the total cost being relatively low.

TABLE III

Comparison of the Gate Drive Weight and Cost for SiC JFET and the cascode GaN/SiC device.

| Switch | Gate Drive Weight [g] | Gate Drive Cost [$] |
|---|---|---|
| SiC JFET | 12.56 | 23.71 |
| Cascode GaN/SiC Device | 0.038 | 1.7 |

Table IV below shows the efficiency comparison of the SiC JFET Class E inverters with different gate voltages. The inverter efficiency is 10% higher when the gate signal swings from −30 V to 0 V compared to from −20 V to 0 V. Although larger gate signal swing causes higher gating loss, it reduces switch transition time and results in lower leakage power. The combined effect is higher inverter efficiency. It is difficult for commercially available gate driver ICs to provide gate signals 30 V swing. However, when used in the cascode GaN/SiC device, the SiC JFET achieves a 40 V gate swing easily (FIG. 9).

TABLE IV

Efficiency Comparison of the SiC JFET Class E Inverter ($V_{in}$ = 200 V) with Different Gate Voltages.

| Gate Voltage [V] | $I_{in}$ [A] | $V_{drain, max}$ (V) | $P_{out}$ [W] | $P_{gate}$ [W] | $\eta_{total}$ |
|---|---|---|---|---|---|
| −20 to 0 | 3.66 | 1074 | 588 | 8.1 | 79.6% |
| −25 to 0 | 3.49 | 1127 | 616 | 17 | 86.2% |
| −30 to 0 | 3.44 | 1165 | 640 | 20 | 90.4% |

Table V below shows the performance comparison of the three inverters. We tested the Class E inverters using the SiC MOSFET, SiC JFET, and cascode GaN/SiC device at Vin=200 V. In addition, we also tested the inverter using the cascode GaN/SiC device at Vin=180 V to make a fair comparison with the other two inverters at a similar output power level. For efficiency calculations, the power consumption in gate drive circuits was considered in all three cases. To ensure a fair comparison with the cascode device, the SiC JFET was driven using a −30 V to 0 V gate signal.

TABLE V

Comparison of Class E Inverters Using SiC MOSFET, SiC JFET, and Cascode GaN/SiC Device.

| Switch | $V_{in}$ [V] | $I_{in}$ [A] | $V_{drain, max}$ [V] | $P_{out}$ [W] | $P_{gate}$ [W] | $\eta_{total}$ |
|---|---|---|---|---|---|---|
| SiC MOSFET | 200 | 3.73 | 1184 | 637 | 39 | 81.1% |
| SiC JFET | 200 | 3.44 | 1165 | 640 | 20 | 90.4% |
| Cascode GaN/SiC Device | 200 | 3.94 | 998 | 718 | 0.56 | 91.1% |
| Cascode GaN/SiC Device | 180 | 3.68 | 828 | 619 | 0.56 | 93.4% |

Figure 12:
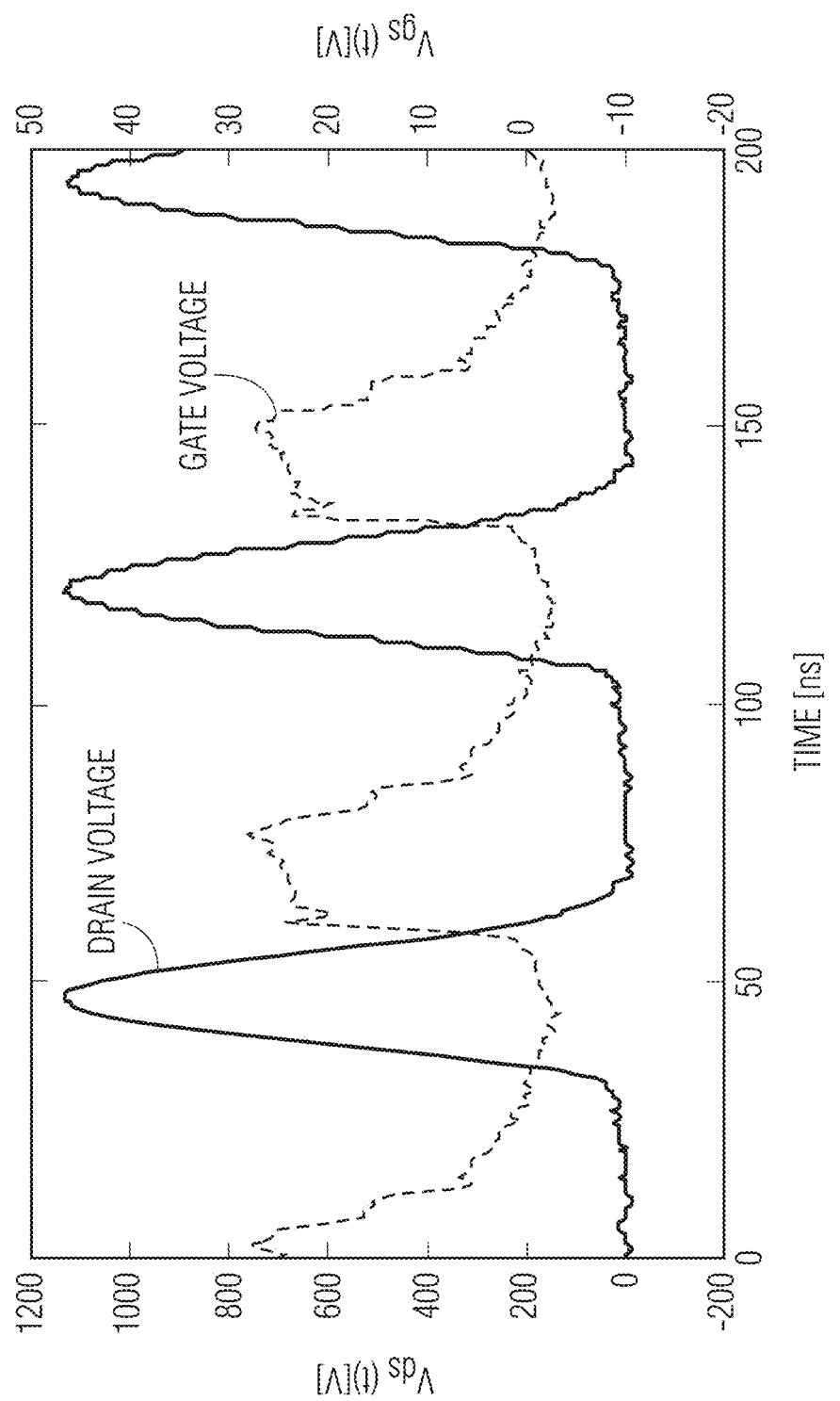
FIG. 12 depicts measured $V_{ds}(t)$ and $V_{gs}(t)$ waveforms of a SiC MOSFET as in the Class E type inverter, in accordance with an example embodiment of the present disclosure.
Figure 13:
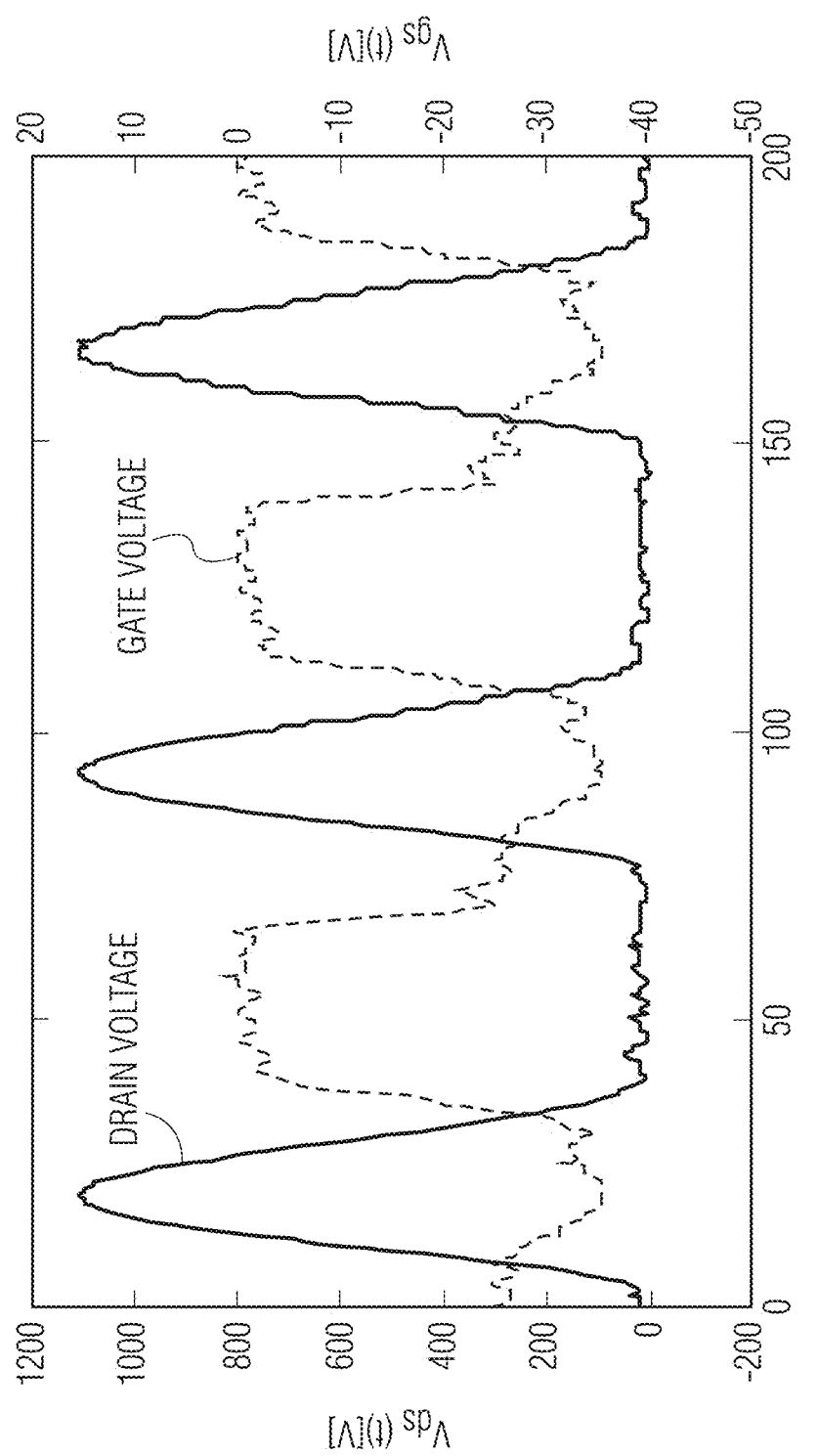
FIG. 13 depicts measured $V_{ds}(t)$ and $V_{gs}(t)$ waveforms of the SiC JFET in the Class E inverter, in accordance with an example embodiment of the present disclosure.

From Table V, it is shown that the inverters using the SiC JFET and cascode device have higher efficiencies than the inverter using SiC MOSFET. One reason may be that the SiC MOSFET has both higher $C_{iss}$ and $C_{oss}$, which leads to both higher gating loss and higher $C_{oss}$ loss at high dV/dt. Another reason may be that the inverter using the SiC MOSFET cannot achieve perfect ZVS due to large package parasitics and long delay time inside the MOSFET. FIG. 12 shows the measured waveforms of the Class E inverter using the SiC MOSFET. To achieve its best performance, a low duty cycle of 36% was used. The inverter efficiency using the cascode GaN/SiC device is slightly higher than that of the SiC JFET. FIG. 13 shows the measured waveforms of the Class E inverter using the SiC JFET. Similarly, the circuit is tuned to have a duty cycle of 44% to achieve the best performance. Comparing with the waveforms of the Class E inverter using the cascode device (FIG. 9), we see that the cascode device has the best ZVS performance among the three switching devices.

As a result of comparing three switches, the inverter using the cascode GaN/SiC device was found to show the highest efficiency and require a much simpler and cheaper auxiliary gate drive circuitry.

In addition to demonstrating the benefits of such a cascode arrangement of FET technologies (e.g., GaN/SiC device) using commercially available discrete parts, this cascode device arrangement may be integrated in an integrated circuit chip, for example, to realize further benefits including, for example, minimization of parasitic impedances.

Most GaN HEMTs used in power applications today are built on Si, SiC, and sapphire substrates. Among these three, Si is the most common one due to its low cost and high availability of large Si wafers. However, it has the highest lattice mismatch (−17%) and thermal expansion mismatch (+116%) to GaN. These mismatches make direct epitaxial growth of GaN/AlN layers on Si substrate difficult, and it is, therefore, necessary or preferred to include a buffer layer in the structure. However, growth of the buffer layer introduces deep traps through foreign dopants, which leads to $C_{oss}$ losses in the GaN-on-Si HEMTs. On the other hand, SiCx has much lower substrate lattice mismatch (+3.5%) and thermal expansion mismatch (+33%), with the trade-off of higher cost. Because of the low mismatch in material properties, there are fewer trapped charges in the buffer layer of the GaN-on-SiC devices. Therefore, GaN-on-SiC devices can have smaller $C_{oss}$ losses than their GaN-on-Si counterparts. Differences in the substrate types also result in different current ratings of the devices. Previous research shows that the maximum drain current of GaN-on-Si devices is only 68% of that of GaN-on-SiC devices. In addition, SiC has 3× higher thermal conductivity than Si, which makes heat removal much easier for GaN-on-SiC devices than for GaN-on-Si devices.

Integrating the cascode GaN/SiC power device may also allow reduction in device parasitics, design for smaller $R_{ds,ON}$, and minimize $R_{g,Jfet}$ to reduce SiC JFET gate power loss. Comparing with SiC MOSFETs of similar voltage rating, the integrated cascode GaN/SiC device may have smaller $R_{ds,ON}$ because of high electron mobility in the channel. As discussed above, minimizing gate resistance can save all of JFET gate power in a soft-switching case, and half of the JFET gate power in a hard-switching case. $R_{g,Jfet}$ depends on doping concentration in the p+ gate region. Since the ionization energy of SiC is high, dopants may not be fully ionized at room temperature, which may result in a high gate resistance. In the next step of integrating the cascode GaN/SiC device, the gate resistance may be minimized by redesigning the device structure and reducing the effective length of the p+ gate region.

Accordingly, in certain example circuit-based embodiments by integrating the two types of (disparate) FET devices such as GaN and SiC devices in cascode, significant benefits may be realized such as in terms of lower $C_{oss}$ losses, higher device ratings, and better thermal conductivity. Integration also provides flexibility of optimizing device parameters to improve efficiency.

As more applications require high-frequency power converters, there is an increasing need for higher-power and faster-switching devices. Such disparate types of devices cascoded as such have been demonstrated successfully, in that there are combined benefits associated with both types (e.g., GaN and SiC devices): simple gate drive circuitry, smaller $C_{oss}$ losses at high frequencies and relatively high voltage blocking capability. This cascode device may be implemented to save all of the SiC JFET gating power in a soft-switching case. In other experimental examples, the cascode (GaN/SiC) FET arrangement is able to block 1.2 kV, consumes only 558 mW in the gate driver at 13.56 MHz, and achieves 91% efficiency in a 13.56 MHz, 700 W Class E inverter. After comparing the performances of the Class E inverters using a SiC MOSFET, SiC JFET and cascode GaN/SiC device, inverter using the cascode device was found to achieve the highest efficiency among all and requires a much simpler, cheaper, and smaller auxiliary gate drive circuitry. This cascode GaN/SiC power device is to be integrated and optimized for high-frequency and high-power circuits.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

It is appreciated that the specification describes and/or illustrates exemplary aspects useful for implementing the claimed disclosure by way of various circuits or circuitry which may be illustrated as or using terms such as blocks, modules, device, system, unit, controller, and/or other circuit-type depictions. Such circuits or circuitry are used together with other elements to exemplify how certain embodiments may be carried out in the form or structures, steps, functions, operations, activities, etc.

For related information regarding details of other embodiments, experiments and applications that can be combined in with the teachings herein, reference may be made to the teachings and underlying references provided in the Appendix of the Provisional Application (fully incorporated by reference) to which priority is claimed and which is entitled: "Cascode GaN/SiC: A Wide-Bandgap Heterogenous Power Device for High-Frequency Applications." As one example, the above Equations 1, 2 and 3 may correspond with the equations also disclosed in said Appendix.

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Also, other technologies and related ranges may be used to extend/change example limits as disclosed herein as may be permitted by applicable technology. Such modifications do not depart from the true spirit and scope of various aspects of the disclosure, including aspects set forth in the claims.

What is claimed is:

1. An apparatus comprising:
   a first type of field-effect transistor (FET) circuit characterized as being a normally-on FET in a switching-circuit operation with a high-voltage rating;
   a second type of FET circuit characterized as being a normally-off FET in a switching-circuit operation with a voltage rating that is less than an order of magnitude than the high-voltage rating of the first type of FET circuit; and
   the first type of FET circuit and the second type of FET circuit configured in a cascode arrangement in which, in response to a switching control signal received by the second type of FET circuit, the second type of FET circuit is active to drive the first type of FET circuit and to mitigate loss of power due to gate loss associated with a gate charge requirement for switching the first type of FET circuit.

2. The apparatus of claim 1, wherein the second type of FET circuit is to drive the first type of FET circuit towards optimization of reduced power loss due to the gate loss associated with the first type of FET circuit.

3. The apparatus of claim 1, wherein the first type of FET circuit refers to or includes a FET having Silicon Carbide (SiC), and the second type of FET circuit refers to or includes a wide bandgap FET.

4. The apparatus of claim 1, wherein the high-voltage rating of the first type of FET circuit is within a range of a few hundred volts to a few kVolts, and the second type of FET circuit has a voltage rating of less than 650 Volts.

5. The apparatus of claim 1, wherein the first type of FET circuit refers to or includes a FET having Silicon Carbide (SiC), the second type of FET circuit refers to or includes a FET having GalliumNitride (GaN), and wherein the high-voltage rating of the first type of FET is within a range of a few hundred volts to a few kVolts.

6. The apparatus of claim 1, wherein first type of FET circuit is further characterized in a switching-circuit operation as having a gate charge requirement for the switching-circuit operation that proportionately tracks, for a range of increasing frequencies of switching-circuit operation, with the gate loss wherein the first type of FET circuit is further characterized in a hard gating switching-circuit operation as having gate loss proportional to its gate charge.

7. An apparatus comprising:
a first type of field-effect transistor (FET) circuit characterized as being a normally-on FET in a switching-circuit operation with a high-voltage rating;
a second type of FET circuit characterized as being a normally-off FET in a switching-circuit operation with a voltage rating that is less than an order of magnitude than the high-voltage rating of the first type of FET circuit; and
the first type of FET circuit and the second type of FET circuit configured in a cascode arrangement in which, in response to a switching control signal received by the second type of FET circuit, the second type of FET circuit is active to drive the first type of FET circuit, wherein the first type of FET circuit and the second type of FET circuit are further characterized respectively according to one of the following: (a) the first type of FET circuit includes an SiC layer and the second type of FET circuit includes a GaN layer that manifests a structural orientation corresponding to epitaxial growth of the GaN layer on the SiC layer; or (b) the first type of FET circuit includes a depletion mode silicon carbide (SiC) junction gate field-effect transistor (JFET), and the second type of FET circuit includes an enhancement mode gallium nitride (GaN).

8. An apparatus comprising:
a first type of field-effect transistor (FET) circuit characterized as being a normally-on FET in a switching-circuit operation with a high-voltage rating;
a second type of FET circuit characterized as being a normally-off FET in a switching-circuit operation with a voltage rating that is less than an order of magnitude than the high-voltage rating of the first type of FET circuit;
the first type of FET circuit and the second type of FET circuit configured in a cascode arrangement in which, in response to a switching control signal received by the second type of FET circuit, the second type of FET circuit is active to drive the first type of FET circuit; and
an integrated circuit chip including the first type of FET circuit and the second type of FET circuit integrated and configured to render, as being negligible, impedance-based parasitics attributable to distance between the first and second types of FET circuits.

9. The apparatus of claim 1, wherein the first type of FET circuit includes a depletion mode silicon carbide (SiC) junction gate field-effect transistor (JFET), and the second type of FET circuit includes an enhancement mode gallium nitride (GaN) high-electron-mobility transistor (HEMT).

10. A system comprising:
a high-frequency switching power circuit including
a first type of field-effect transistor (FET) circuit characterized as being a normally-on FET in a switching-circuit operation with a high-voltage rating,
a second type of FET circuit characterized as being a normally-off FET in a switching-circuit operation with a voltage rating that is less than an order of magnitude than the high-voltage rating of the first type of FET circuit, and
the first type of FET circuit and the second type of FET circuit configured in a cascode arrangement in which, in response to a control signal received by the second type of FET circuit, the second type of FET circuit is to drive the first type of FET circuit; and
a circuit-based load to collect energy in response to the control signal causing the second type of FET circuit to activate and drive the first type of FET circuit for mitigating loss of power due to gate loss associated with a gate charge requirement for switching the first type of FET circuit.

11. A system comprising:
a high-frequency switching power circuit including
a first type of field-effect transistor (FET) circuit characterized as being a normally-on FET in a switching-circuit operation with a high-voltage rating,
a second type of FET circuit characterized as being a normally-off FET in a switching-circuit operation with a voltage rating that is less than an order of magnitude than the high-voltage rating of the first type of FET circuit, and
the first type of FET circuit and the second type of FET circuit configured in a cascode arrangement in which, in response to a control signal received by the second type of FET circuit, the second type of FET circuit is to drive the first type of FET circuit; and
a circuit-based load to collect energy in response to the control signal causing the second type of FET circuit to activate and drive the first type of FET circuit, wherein the high-frequency switching power circuit is coupled to the circuit-based load wirelessly.

12. The system of claim 10, wherein the second type of FET circuit is to drive the first type of FET circuit towards optimization of reduced power loss due to the gate loss associated with the first type of FET circuit, wherein the first type of FET circuit refers to or includes a FET having Silicon Carbide (SiC), and the second type of FET circuit refers to or includes a wide bandgap FET, and the system further comprising an integrated circuit chip including the first type of FET circuit and the second type of FET circuit integrated and configured to render as being negligible impedance-based parasitics attributable to distance between the first and second types of FET circuits.

13. The system of claim 10, wherein the first type of FET circuit includes a depletion mode silicon carbide (SiC) junction gate field-effect transistor (JFET).

14. A system comprising: a high-frequency switching power circuit including
a first type of field-effect transistor (FET) circuit characterized as being a normally-on FET in a switching-circuit operation with a high-voltage rating,
a second type of FET circuit characterized as being a normally-off FET in a switching-circuit operation with a voltage rating that is less than an order of magnitude than the high-voltage rating of the first type of FET circuit, and
the first type of FET circuit and the second type of FET circuit configured in a cascode arrangement in which, in response to a control signal received by the second type of FET circuit, the second type of FET circuit is to drive the first type of FET circuit; and
a circuit-based load to collect energy in response to the control signal causing the second type of FET circuit to activate and drive the first type of FET circuit, wherein the second type of FET circuit includes an enhancement mode gallium nitride (GaN) high-electron-mobility transistor (HEMT).

15. A method comprising:
providing a first type of field-effect transistor (FET) circuit characterized as being a normally-on FET in a switching-circuit operation with a first high-voltage rating;
providing a second type of FET circuit characterized as being a normally-off FET in a switching-circuit operation with a voltage rating that is less than an order of magnitude than the first high-voltage rating of the first type of FET circuit, wherein the first type of FET circuit is further characterized in a switching-circuit operation as having a gate charge requirement for the switching-circuit operation that proportionately tracks, for a range of increasing frequencies of the switching-circuit operation, with a gate loss associated with the first type of FET circuit; and presenting a switching control signal to the second type of FET circuit and causing the second type of FET circuit to activate and drive the first type of FET circuit, while configured in a cascode arrangement.

16. The method of claim 15, wherein the second type of FET circuit drives the first type of FET towards optimization of, or to at least mitigate, loss of power due to the gate loss.

17. The method of claim 15, wherein the first type of FET circuit refers to or includes a FET having Silicon Carbide (SiC), and the second type of FET circuit refers to or includes a wide bandgap FET.

18. The method of claim 15, wherein the high-voltage rating of the first type of FET circuit is within a range of a few hundred volts to a few kVolts, and the second type of FET circuit has a voltage rating of less than 650 Volts.

19. The method of claim 15, wherein the first type of FET circuit refers to or includes a FET having Silicon Carbide (SiC), the second type of FET circuit refers to or includes a FET having GalliumNitride (GaN), and wherein the high-voltage rating of the first type of FET is within a range of a few hundred volts to a few kVolts.

20. The method of claim 15, wherein the first type of FET circuit is further characterized as including an SiC layer, wherein the second type of FET circuit includes a GaN layer that manifests a structural orientation corresponding to epitaxial growth of the GaN layer on the SiC layer, and wherein the first type of FET circuit and the second type of FET circuit are integrated and configured to render as being negligible, impedance-based parasitics attributable to distance between the first and second types of FET circuits.

* * * * *